(12) United States Patent
Willcock

(10) Patent No.: US 10,976,943 B2
(45) Date of Patent: Apr. 13, 2021

(54) APPARATUSES AND METHODS TO CHANGE DATA CATEGORY VALUES

(71) Applicant: Micron Technology, Inc., Boise, ID (US)

(72) Inventor: Jeremiah J. Willcock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/939,999

(22) Filed: Jul. 27, 2020

(65) Prior Publication Data

US 2020/0356286 A1   Nov. 12, 2020

Related U.S. Application Data

(62) Division of application No. 16/542,827, filed on Aug. 16, 2019, now Pat. No. 10,725,680, which is a
(Continued)

(51) Int. Cl.
*G06F 3/06* (2006.01)
*G11C 11/4091* (2006.01)
(Continued)

(52) U.S. Cl.
CPC .......... *G06F 3/0629* (2013.01); *G11C 7/1006* (2013.01); *G11C 7/1012* (2013.01);
(Continued)

(58) Field of Classification Search
CPC ............................. G06F 3/0604; G06F 3/0629
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Muna A Techane
(74) *Attorney, Agent, or Firm* — Brooks, Cameron & Huebsch, PLLC

(57) ABSTRACT

The present disclosure includes apparatuses and methods to change data category values. An example is a memory device that includes an array having a plurality of sequences of memory cells, where each of the respective sequences of memory cells includes a plurality of designated subsets of memory cells, and the array includes a counter corresponding to one of the plurality of designated subsets of memory cells. The memory device is configured to receive input corresponding to a data batch, where the input includes a designation that corresponds to the one of the plurality of designated subsets of memory cells to be conditionally updated, and to change a numerical value stored by the counter corresponding to the one of the plurality of designated subsets of memory cells.

18 Claims, 8 Drawing Sheets

Related U.S. Application Data division of application No. 15/280,596, filed on Sep. 29, 2016, now Pat. No. 10,387,058.

(51) Int. Cl.
  *G11C 11/413* (2006.01)
  *G11C 7/10* (2006.01)

(52) U.S. Cl.
  CPC ........ *G11C 11/4091* (2013.01); *G11C 11/413* (2013.01); *G11C 2211/4013* (2013.01)

(58) Field of Classification Search
  USPC ......................................................... 711/105
  See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffman et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,812,775 A * | 9/1998 | Van Seters | H04L 49/90 |
| | | | 709/213 |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,470,415 B1 * | 10/2002 | Starr | G06F 5/10 |
| | | | 711/104 |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,139,213 B2 * | 11/2006 | Rao | G06F 13/1684 |
| | | | 365/230.05 |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |

(56) References Cited

U.S. PATENT DOCUMENTS

| | | |
|---|---|---|
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,539,513 B1* | 9/2013 | Starr .................. G06F 9/45533 719/319 |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,349,482 B2 | 1/2016 | Kim et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0198662 A1 | 8/2008 | Mokhlesi |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0228238 A1 | 9/2009 | Mansinghka et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0134703 A1 | 6/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1* | 6/2012 | Agam .................. G11C 11/403 365/49.1 |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |

(56) References Cited

U.S. PATENT DOCUMENTS

| | | | |
|---|---|---|---|
| 2016/0062733 | A1 | 3/2016 | Tiwari |
| 2016/0063284 | A1 | 3/2016 | Tiwari |
| 2016/0064045 | A1 | 3/2016 | La Fratta |
| 2016/0064047 | A1 | 3/2016 | Tiwari |
| 2016/0098208 | A1 | 4/2016 | Willcock |
| 2016/0098209 | A1 | 4/2016 | Leidel et al. |
| 2016/0110135 | A1 | 4/2016 | Wheeler et al. |
| 2016/0125919 | A1 | 5/2016 | Hush |
| 2016/0154596 | A1 | 6/2016 | Willcock et al. |
| 2016/0155482 | A1 | 6/2016 | La Fratta |
| 2016/0188250 | A1 | 6/2016 | Wheeler |
| 2016/0196142 | A1 | 7/2016 | Wheeler et al. |
| 2016/0196856 | A1 | 7/2016 | Tiwari et al. |
| 2016/0225422 | A1 | 8/2016 | Tiwari et al. |
| 2016/0266873 | A1 | 9/2016 | Tiwari et al. |
| 2016/0266899 | A1 | 9/2016 | Tiwari |
| 2016/0267951 | A1 | 9/2016 | Tiwari |
| 2017/0169902 | A1* | 6/2017 | Chun .............. G06F 11/1016 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

* cited by examiner

APPARATUSES AND METHODS TO CHANGE DATA CATEGORY VALUES

PRIORITY INFORMATION

This application is a Divisional of U.S. application Ser. No. 16/542,827, dated Aug. 16, 2019, which issues as U.S. Pat. No. 10,725,680 on Jul. 28, 2020, which is a Continuation of U.S. application Ser. No. 15/280,596, filed Sep. 29, 2016, which issued as U.S. Pat. No. 10,387,058 on Aug. 20, 2019, the contents of which are included herein by reference.

TECHNICAL FIELD

The present disclosure relates generally to semiconductor memory and methods, and more particularly, to apparatuses and methods to change data category values.

BACKGROUND

Memory devices are typically provided as internal, semiconductor, integrated circuits in various computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processing-in-memory device, in which a processor may be implemented internally and near to a memory (e.g., directly on a same chip as the memory array). A processing-in-memory device may save time by reducing and eliminating external communications and may also conserve power.

DETAILED DESCRIPTION

Figure 1A:
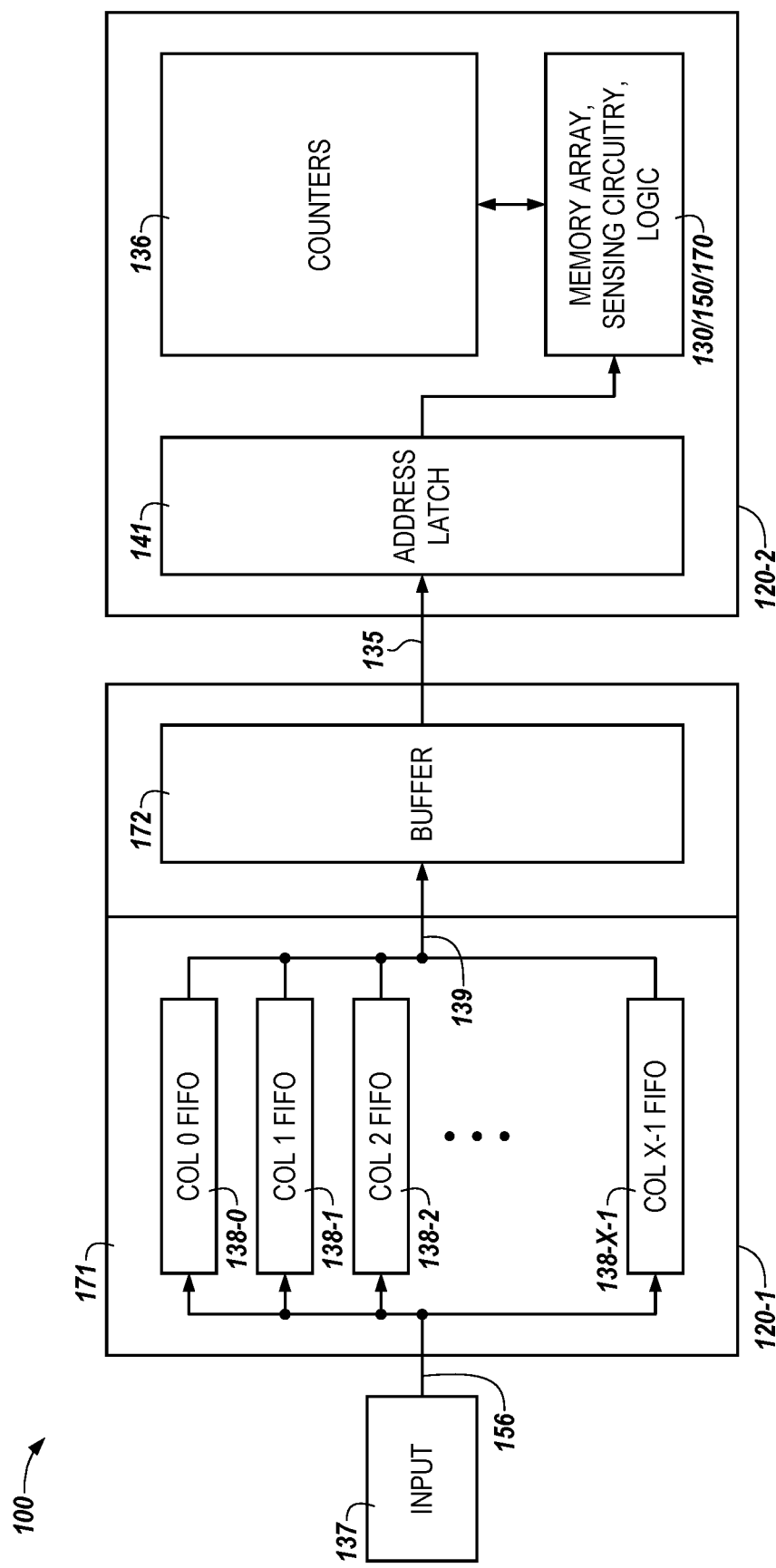
FIG. 1A is a block diagram of a number of memory devices in a system to change data category values in accordance with a number of embodiments of the present disclosure.

The present disclosure includes apparatuses and methods to change data category values. As described herein, to change data category values is intended to mean to cause a change, e.g., a discrete increase (increment) or a decrease (decrement), in a count, e.g., a numerical value, stored in a particular counter for a particular data category. The count may represent a frequency at which a particular data value falls into a particular category of data values. In various embodiments, the data category may be the particular data value and/or a range of data values.

An example is a memory device that includes an array having a plurality of sequences of memory cells, where each of the respective sequences of memory cells includes a plurality of designated subsets of memory cells, and the array includes a counter corresponding to, e.g., associated with and/or coupled to, one of the plurality of designated subsets of memory cells. The memory device is configured to receive input corresponding to a data batch, where the input includes a designation that corresponds to the one of the plurality of designated subsets of memory cells to be conditionally updated. The memory device is further configured to change a numerical value stored by the counter corresponding to the one of the plurality of designated subsets of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 150 may reference element "50" in FIG. 1A, and a similar element may be referenced as 550 in FIG. 5. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

A processing-in-memory (PIM) device is a memory device having a number of processing resources in the memory device that are selectably coupled to columns of an array of memory cells and on a same chip as the array, as described further herein. A PIM capable memory device, as described herein, may be a dynamic random access memory (DRAM) device. A PIM capable device may include sensing circuitry, e.g., including sense amplifiers, compute components, and/or logical circuitry, configured to perform various operations. The sensing circuitry of the DRAM device may be configured for performing compute, arithmetic, and/or logical operations on one or more operands. For example, the operations may include performing compute operations, e.g., read, write, erase, etc., performing arithmetic operations, e.g., add, subtract, multiply, divide, etc. one operand from another, and performing logical operations, e.g., AND, OR, XOR, NOT, etc., on one or more operands. By placing the processing resources, e.g., sensing circuitry, directly within the memory device, the PIM capable device may experience reduced power consumption.

In various embodiments, a DRAM device may be formed, e.g., positioned, on a same chip, e.g., die, as a static random access memory (SRAM) device, e.g., a number of SRAM devices may be formed in and/or in association with a controller on the same chip as the DRAM device, as described herein. Alternatively or in addition, a number of SRAM devices may be formed, e.g., positioned, on a chip, e.g., die, that is separate from the chip on which the DRAM device and/or the controller of the DRAM device are positioned. Moreover, a SRAM device may be positioned on a chip that is separate from a host configured to interact with the DRAM device, the controller of the DRAM device, and/or the SRAM device.

Histograms may be useful to reveal frequencies of particular data values in a set of data, e.g., a data batch, at a particular time point and/or following input of updates to the data values. A histogram can represent, for example, the frequency at which a particular data value falls into a particular category of data values, e.g., the particular data value or a range of data values. Histograms may be useful for operations that do not rely on knowledge of the actual data values, e.g., operations that depend on the presence, absence, and/or frequency of a particular type of data value rather than the actual data values themselves.

Computing systems, including those using PIM capable memory devices, may use histograms for various tasks, e.g., comparison operations, among other types of operations. Examples of comparison operations may include determining: whether a data set contains at least one of a specific type of data value; what is the most common data value and/or data value category; metadata for data values in a data set, e.g., a histogram detailing the intensity of the pixels for an image; and/or algorithms for color quantization of bitmap images, e.g., clustering algorithms, that may use a histogram of the image data to determine the mapping between the colors displayed in the original image and the color palette of the quantized image; among other implementations In some previous implementations for creation of a histogram, a processor in a host and/or in a DRAM device may assign a counter to each type of data value category. These counters each may be disposed within the processor and/or may be positioned in a DRAM memory array assigned to the categories. The processor in the host and/or in the DRAM device may read each incoming data value, e.g., in an update, to determine which category the data value belongs in and enable a count, e.g., a stored numerical value, in the appropriate counter to be changed.

However, this may consume a lot of resources in the host and/or DRAM device. For example, the DRAM device may have, e.g., need, a number of components for reading and analyzing disorganized data input to determine the appropriate category for the data value and to assign the data value to that category, a number of components for writing an indicator of the presence of that data value in the category to an assigned location in the DRAM memory array, and/or a number of components to determine if and/or by how much the appropriate counters should be changed. Performing all of this data processing by the host and/or the DRAM device may underutilize different capacities and/or efficiencies of various computing resources. As such, creating a histogram in this manner may unnecessarily prolong computing time relative to improved utilization of the various computing resources.

For example, a SRAM device with an array of first in, first out (FIFO) components, e.g., FIFO queues, may, in some embodiments, be more efficient at reading and analyzing the data input to determine the appropriate category for the data value, assigning the data value to that category, and/or providing the indicator of the presence of that data value in the category to be sent to the assigned location in the DRAM memory array. The PIM capable DRAM device may, in some embodiments, be more efficient at writing the indicator of the presence of the data value in the category in the assigned location in the DRAM memory array and/or in determining if and/or by how much the appropriate counters should be changed, as described further herein.

As such, it may be beneficial to implement an improvement in apparatuses and methods to change data category values for creating a histogram, e.g., to increase the efficiency of the process and/or to decrease the computing time of the process. As described herein, such an improvement may be achieved by combination of a SRAM device with a DRAM device to realize processing advantages of each type of memory device. Further, it may also be beneficial to realize the advantage of the proximity between the processing resources, e.g., in the sensing circuitry, and the array of memory cells in the DRAM device.

Accordingly, described herein is an architecture that combines a SRAM device, control circuitry, and use of sequential storage of indicators of data values on a PIM capable DRAM device, which may be positioned, in combination, on one or more of the chips. Sequential storage, as used herein, is intended to mean storage of data values in a sequence of memory cells. Such a sequence may be column oriented, row oriented, and/or a combination thereof, e.g., diagonally oriented in multiple columns and/or rows, and/or oriented in a configuration with rectilinear steps, in an array of memory cells, e.g., a PIM capable DRAM device.

An array of the SRAM device may, as described further herein, be divided into a number of FIFO components corresponding to a number of categories of data values. For example, there may be one FIFO component designated per column of memory cells and/or number of designated counters on the DRAM device that correspond to the number of categories of data values. Changes to the counts, e.g., numerical values, recorded by the counters may correspond to the indicators of the data values assigned by and stored in the respective designated FIFO components that are sent to and stored in designated columns of the DRAM device.

Periodically and/or when at least one of the FIFO components is full of the indicators, e.g., reaches a predetermined upper limit of the respective indicators, each FIFO component may output its indicators, e.g., all of the indicators in each FIFO component, as a block of indicators that is sent to the DRAM device as a unit, e.g., a data batch. PIM circuitry on the DRAM device, e.g., sensing circuitry coupled to the DRAM memory array, logic, e.g., logic circuitry, as described herein, may then be controlled, e.g., by a controller, to write the updated indicators. For example, the updated indicators may be written to a designated location in a column of memory cells corresponding to the appropriate data category. As such, the PIM circuitry used for storage of the indicators in the designated columns may be column oriented. Accordingly, the PIM circuitry may, in some embodiments, not support shifting of data to the right or left in the array, e.g., to limit impact of the PIM circuitry on the die area. The PIM circuitry on the DRAM device also may be controlled, e.g., by the controller, to change counts of the updated indicators in designated counters corresponding to the appropriate columns.

In some embodiments, the counters may be formed as part of the array 130, e.g., as shown and described in connection with counters 136 in FIG. 1B, and may be selectably coupled to one of the plurality of designated subsets of memory cells. For example, the counters also may be oriented in columns, e.g., designated to the appropriate columns 122 in a corresponding DRAM array, which may enable efficient changes of counts by the column oriented PIM circuitry. In some embodiments, the counters may be formed as logic circuitry discrete from the array 130, e.g., as shown and described in connection with counters 136 in FIG. 1A, that may be associated with, e.g., selectably coupled to, the one of the plurality of designated subsets of memory cells. As described in connection with FIG. 1A, among other locations herein, the counters may be selectably coupled, in some embodiments, via an indicator that indicates, e.g., designates, a particular counter associated with the position of the subset of memory cells in a particular column to which the indicator is to be written.

Implementation of the combination of a SRAM device and a PIM capable DRAM device, as described herein, may enable high rates of speed for histogramming, e.g., creating original histograms and/or updates thereof. For example, billions of indicator updates may be performed per second.

FIG. 1A is a block diagram of a number of memory devices in a system to change data category values in accordance with a number of embodiments of the present disclosure. The system 100 shown in FIG. 1A can include a first memory device 120-1 and a second memory device 120-2. For example, the first memory device 120-1 and the second memory device 120-2 of system 100 can include separate integrated circuits and/or be formed, e.g., positioned, on separate chips, e.g., dies, or both the first memory device 120-1 and the second memory device 120-2 can be formed, e.g., positioned, on the same chip, e.g., die, as a single integrated circuit.

In various embodiments, the first memory device 120-1 can be configured to receive input 137 of data values, e.g., which may be disorganized, organized, and/or unstructured data values. For example, in some embodiments, the first memory device 120-1 may receive the input 137 via a data bus 156, e.g., an I/O bus from a host 510, as shown in and described in connection with FIG. 5. The data values may be accessed by the host 510 from a number of non-volatile and/or volatile system memory sources (not shown) in which the presence and/or number of various data values may vary as a function of time. In some embodiments, the host 510 may be configured to send updated data batches, e.g., periodically when a set time period has elapsed between data batches being sent, after the original data batch has been sent to the first memory device 120-1. In some embodiments, a controller (not shown) of the first memory device 120-1 and/or a controller of the second memory device 120-2, e.g., as shown at 140 and at 540 and described in connection with FIGS. 1B-1D and FIG. 5, respectively, may be configured to retrieve, e.g., periodically, the data values from the number of non-volatile and/or volatile system memory sources. In some embodiments, the number of non-volatile and/or volatile system memory sources may be configured to send, e.g., periodically, the data values as the input 137 to the first memory device 120-1.

In various embodiments, the first memory device 120-1 may be configured with an array 171 of a number of FIFO components, e.g., 138-0, 138-1, . . . , 138-X–1, corresponding to a number of categories of data values. The first memory device 120-1 may be configured to assign an indicator to each data value in input of a stream of data, e.g., the disorganized, organized, and/or unstructured data values, and assign the indicator of the data value to a corresponding FIFO component, e.g., one of FIFO components 138-0, 138-1, . . . , 138-X-1. As described further herein, the indicators may be a code of a set number of bits, e.g., four bits, among other possible numbers of bits, that directly or indirectly indicates a particular category to which each data value has been determined to belong by the first memory device 120-1.

In some embodiments, there may be one FIFO component designated per column of memory cells. For example, there may be one of FIFO components 138-0, 138-1, . . . , 138-X-1 per each of the X columns 122 in a bank 121 shown in and described in connection with FIG. 1B and/or an array 130 of memory cells shown in and described in connection with the second memory device 120-2 in FIG. 1A and in FIG. 1B. Embodiments in which each FIFO component in the first memory device 120-1 is designated to a corresponding column in the second memory device 120-2 may thus determine the category corresponding to a particular column in the second memory device 120-2 in which the indicator is to be stored, e.g., written. In such embodiments, the indicator may indicate a position of a subset of memory cells in the particular column to which the indicator is to be written.

The indicator may, in some embodiments, indicate a particular counter associated with and/or coupled to the position of the subset of memory cells in the particular column to which the indicator is to be written. For example, the indicator may determine selection of the particular counter from a plurality of counters in the second memory device 120-2, e.g., counters as shown at 136 and 536 and described in connection with FIGS. 1A and 5, respectively. Accordingly, the indicator may, in some embodiments, indicate a column of counters on the second memory device 120-2 that correspond to the number of categories of data values and/or the number of columns of memory cells in the bank 121 and/or an array 130.

The indicators corresponding to the data batch may be output 139 from the FIFO components 138-0, 138-1, . . . , 138-X-1, e.g., in parallel. In some embodiments, the plurality of designated FIFO components in the array 171 in the first memory device 120-1 may be horizontally oriented and the plurality of columns 122 in the array 130 of memory cells in the second memory device 120-2 may be vertically oriented. As such, the output 139 from the FIFO components may be sent to a buffer, e.g., as shown at 172 and 572 and described in connection with FIGS. 1A and 5, respectively, configured to perform a corner turn operation on the bit sequences of the indicators. In various embodiments, the corner turn buffer 172 may include a buffer array of memory cells (not shown). The corner turn buffer 172 also may include, or be associated with, decode circuitry, e.g., as shown at 573 and described in connection with FIG. 5, coupled to the buffer array.

The corner turn buffer 172 and/or the decode circuitry 573 may be configured to receive the plurality of indicators of the plurality of data values. Each indicator may include M bits of data, as output 139 by the plurality of designated FIFO components as the data batch. The corner turn buffer 172 and/or the decode circuitry 573 may be further configured to perform the corner turn operation on an indicator by modifying, on a per column basis, designation, e.g., address, bits corresponding to the M bits of data from a designated FIFO component to an address of a designated position from a plurality of positions, e.g., a plurality of subsets of memory cells in each column. For example, an interface 135 can be configured to enable data, e.g., the indicators, to move, e.g., be transferred, from the first memory device 120-1 to the second memory device 120-2. Movement of the indicator to the second memory device 120-2 enables the indicator to be written within the designated column and/or designated subset of the column of the second memory device 120-2.

Alternatively or in addition, the first memory device 120-1 and the second memory device 120-2 may, in some embodiments, be associated with other circuitry (not shown) to implement the movement of the output 139 from the horizontally oriented FIFO components 138 to the vertically oriented columns 122 of memory cells. Such circuitry may operate by selecting one bit of an indicator at a time from each FIFO component in order to put the indicators into the appropriate memory cells in the designated column in the correct order.

The indicators moved from the first memory device 120-1 to the second memory device 120-2 may, in some embodiments, be received and/or temporarily stored by an address latch 141, e.g., in the second memory device 120-2. The address latch 141 may temporarily store the indicators in a number of rows and/or columns corresponding to the number of bits in the indicator, e.g., four bits per indicator, that corresponds to a designation of a particular column and/or a designation of a subset of memory cells in a particular column of the second memory device 120-2.

The indicators may be moved directly from the first memory device 120-1 or from the address latch 141 to designated columns and/or subsets of memory cells in each column in an array of memory cells in the second memory device 120-2, e.g., an array as shown at 130, 230, and 530 and described in connection with FIGS. 1B, 2, and 5, respectively. As described further herein, each array of memory cells, e.g., memory array, may be associated with, e.g., coupled to, sensing circuitry 150, e.g., as shown at 250 and 550 and described in connection with FIGS. 2, 3, and 5. Each array 130 and/or the associated sensing circuitry 150 may be further associated with, e.g., coupled to, logic circuitry 170, e.g., as shown at 570 and described in connection with FIGS. 3-5.

The plurality of counters 136 in the second memory device 120-2 may be associated with, e.g., coupled to, each of the columns and/or designated subsets of memory cells in each of the columns of the second memory device 120-2. Accordingly, changes to the counts, e.g., numerical values, in the counters may be determined by operations, as described further herein, performed by the sensing circuitry 150, e.g., the sense amplifiers 206 and 306 and compute components 231 and 331, respectively, and/or the logic circuitry 170 described in connection with FIGS. 2 and 3.

In some embodiments, the first memory device 120-1 including the FIFO components may be, or may include, an array 171 that is a SRAM array. In some embodiments, the second memory device 120-2 including the array 130 of memory cells may be, or may include, a DRAM array. However, embodiments are not so limited. For example, in some embodiments, both the first memory device 120-1 and the second memory device 120-2 may be the same type of memory device and/or either of the first memory device 120-1 and the second memory device 120-2 may be a memory device other than SRAM and/or DRAM.

Figure 1B:
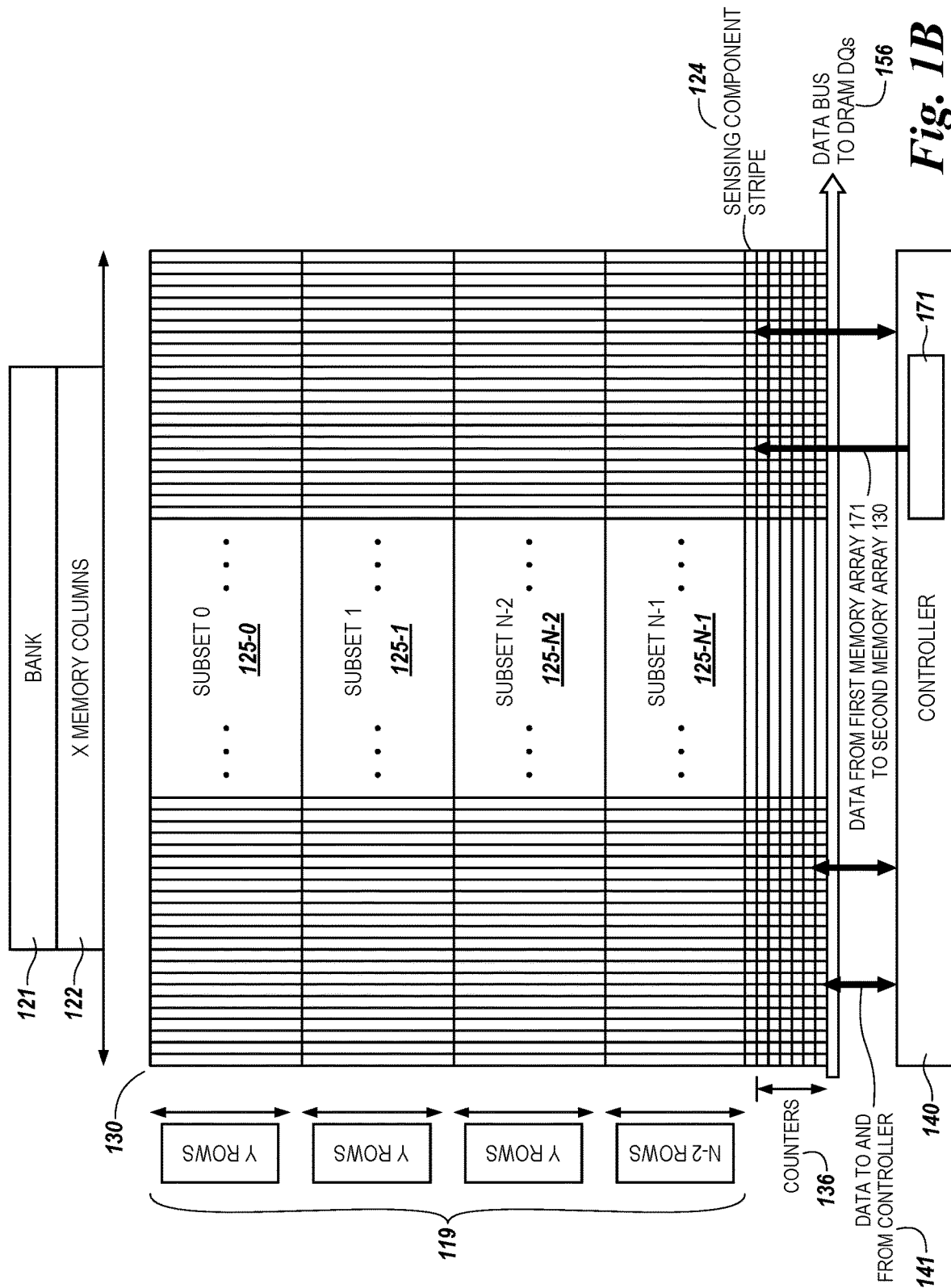
FIG. 1B is a block diagram of section of a bank of a memory device in accordance with a number of embodiments of the present disclosure.

FIG. 1B is a block diagram of a section of a bank 121 of a memory device, e.g., the second memory device shown at 120-2 and described in connection with FIG. 1A, in accordance with a number of embodiments of the present disclosure. For example, the bank 121 can represent an example section of a number of bank sections of a bank of a memory device, e.g., bank section 0, bank section 1, . . . , bank section M (not shown). As shown in FIG. 1B, a bank 121 can include a plurality of memory columns 122 shown horizontally as X, e.g., $2^{21}$=2,097,152 columns, among other possibilities, in an example DRAM bank and bank section. Additionally, the bank section 121 may, in some embodiments, be divided into a plurality of designated subsets of memory cells, e.g., subset 0, subset 1, . . . , subset N−2, subset N−1 shown at 125-0, 125-1, . . . , 125-N−2, 125-N−1, for each of the plurality of memory columns 122. In some embodiments, the plurality of columns 122 of the plurality of designated subsets of memory cells 125, e.g., the memory cells in each subset, may be associated with, e.g., selectably coupled to, amplification regions, e.g., in a sensing component stripe 124, configured to be coupled to a data path, e.g., a data bus as shown at 156 and 556 and described in connection with FIGS. 1B and 5, respectively, and/or a data path as shown at 155 and described in connection with FIG. 1C. Alternatively, the subsets 125-0, 125-1, . . . , 125-N−1, 125-N−1 may, in some embodiments, each have an amplification region 124 coupled thereto that corresponds to a sensing component stripe.

Each column 122 is configured to be coupled to sensing circuitry, e.g., as shown at 150, 250, and 550 and described in connection with FIGS. 1A, 2, 3, and 5, and elsewhere herein. As such, each column for a subset can be coupled individually to a sense amplifier and/or compute component that contributes to a sensing component stripe 124 for that subset. For example, as shown in FIG. 1B, the bank section 121 can include sensing component stripe 124 that has sensing circuitry with sense amplifiers and/or compute components. The sense amplifiers and/or compute components can, in various embodiments, be used as registers, cache and data buffers that can be coupled to each column 122 in the subsets 125-0, 125-1, . . . , 125-N−2, 125-N−1.

Each of the subsets 125-0, 125-1, . . . , 125-N−1 can include a plurality of rows 119, e.g., shown vertically as Y. In some embodiments, the designation and/or the indicator may be a number of coded bits that corresponds to a designation of a particular counter, from among a plurality of counters 136, associated with a particular designated subset of memory cells. As used herein, the designation of the counter is intended to mean a number assigned to the counter, e.g., in binary bits, in a particular column, e.g., designating one of counters 0-7 corresponding to the designated subsets in the column, which also may correspond to a designation, e.g., an address, for a particular designated subset in the column. For example, each subset may include a number of rows and/or memory cells per column, e.g., 32 rows, in an example DRAM bank. For example, a multiple of 4 rows and/or memory cells per column 122 may correspond, in some embodiments, to a multiple of the number of bits in each indicator that are to be stored in the designated subsets of memory cells in each column. Each of the designated subsets of memory cells in each column may correspond to the designation for a particular designated subset included in the indicator sent by the first memory device 120-1, which corresponds to the designation of the particular counter. The example embodiments are not limited to the example horizontal and vertical orientation of columns and rows described herein or the example numbers thereof.

A null value, as described herein, is intended to mean that input from the corresponding designated FIFO component of the array 171 in the first memory device 120-1 included an indicator of no data value for the corresponding one of the designated subsets. Receipt of the null value by the second memory device 120-2 may result in none of the designated counters for the designated column being changed, e.g., the null value not being stored and/or by no signal being sent to a designated counter. In some embodiments, the null value may be stored in a subset, e.g., subset 125-N−1, although a counter may not be designated to that subset, in some embodiments. For example, the null value may be sent to the second memory device 120-2 and stored in memory cells of a column, e.g., as a placeholder, without affecting the change operations, e.g., by not having the designated counter.

In some embodiments, each of the respective columns 122 of the array 130 of memory cells in the second memory device 120-2 corresponding to the plurality of data categories may include a subset, e.g., subset 125-N−1, of the plurality of designated subsets that is designated to store a null value in a row corresponding to, in various embodiments, each of the remaining designated subsets, e.g., 125-0, 125-1, . . . , 125-N−2. For example, designated subsets 125-0, 125-1, . . . , 125-N−2 for indicator storage may correspond to 15 designated subsets, e.g., subsets 0-14, and the designated subset for null value storage may correspond to a total of 16 designated subsets. Four bits in each indicator corresponds to $2^4$=16 different designations of designated subsets and/or counters in each column. Accordingly, 15 of the designations in the indicators assigned by the first memory device 120-1 and sent by the number of FIFO components, e.g., 138-0, 138-1, . . . , 138-X−1, corresponding to a number of categories of data values and/or columns 122 may correspond to the designated subsets 125-0, 125-1, . . . , 125-N−2 in which the indicators are to be stored.

In contrast, a special indicator, e.g., four binary bits of 0000, of the null value may be sent by the first memory device 120-1 to indicate that the null value for a designated subset in the column is to be stored in designated subset 125-N−1, e.g., subset 15. Because each of the null values corresponds to one of the number of designated subsets 125-0, 125-1, . . . , 125-N−2, e.g., subsets 1-14, for indicator storage in each column 122, the number of rows and/or memory cells in each column of designated subset 125-N−1 for null value storage can be 15, which corresponds to a value of N−2 as the designated subsets are numbered. For example, each memory cell in each row of designated subset 125-N−1 may store a null value, e.g., 0 in binary. The row in which the null value may be stored corresponds to one of the remaining designated subsets for indicator storage to indicate that original input and/or updated input from the corresponding designated FIFO component 138 in the first memory device 120-1 included the special indicator of no data value for the corresponding one of the remaining 15 designated subsets.

As described herein, the bank may include $2^{21}$=2,097,152 columns with 15 designated subsets, where each of the designated subsets may be associated with and/or coupled to a respective counter. In some embodiments, each of the designated subsets for indicator storage may include 32 rows and/or memory cells per column. In such an embodiment, only the 32 rows of memory cells per column in each of the 15 designated subsets can provide data that may result in changing the counts, e.g., numerical values, previously stored in a counter associated with each of the 15 designated subsets in each column. Accordingly, there may be 15×$2^{21}$=31,457,280 of the counters 136 per bank 121, where each of the counters may be a 32 bit counter. As described herein, each indicator can include the designation of a particular counter, which corresponds to a particular designated subset for indicator storage.

As shown in FIG. 1B, the bank 121 can be associated with, e.g., coupled to, a controller 140. The controller 140 shown in FIG. 1B can, in various embodiments, represent at least a portion of the functionality embodied by and contained in the controller shown at 540 and described in connection with FIG. 5. The controller 140 can direct, e.g., control, input of control signals based on commands and data to the bank and output of data from the bank, e.g., to the host 510, along with control of data movement in the bank, as described herein. The bank can include a data bus 156, e.g., a 64 bit wide data bus, to DRAM DQs, which can correspond to the data bus 556 described in connection with FIG. 5.

In some embodiments, the controller 140 may include, or be associated with, the array of the number of a number of FIFO components, e.g., as shown at 171 and 571 and described in connection with FIGS. 1A and 5, respectively. In such a configuration, data, e.g., the indicators, may be sent from a first memory array 171, e.g., a SRAM array, in the bank 121 to a second memory array 130 in the bank, e.g., a DRAM array. However, embodiments are not so limited. For example, as described herein, the first array 171 may be formed, e.g., positioned, on a chip of the first memory device 120-1 that is separate from a chip on which the second memory device 120-2 is positioned, where the second memory device 120-2 may include, as shown in FIG. 1B, the second array 130 of memory cells and the controller 140, e.g., in a PIM capable DRAM configuration.

Accordingly, as described herein, an apparatus can, in various embodiments, have a first memory device 120-1 that includes a first array 171 having a plurality of FIFO components 138. The first memory device 120-1 may be configured to store an indicator of a data value, e.g., where the indicator indicates that the data value is in one of a plurality of data categories, in a designated FIFO component corresponding to the one of the plurality of data categories. The first memory device 120-1 can be further configured to send indicators of a plurality of data values stored by a plurality of designated FIFO components as a data batch. The apparatus can, in various embodiments, have a second memory device 120-2 that includes a second array 130 having a plurality of columns 122 of memory cells.

The first memory device 120-1, e.g., a controller of thereof (not shown), may be configured to send a subset of a plurality of indicators in the data batch to a designated column and/or a designated subset in the column. For example, a particular indicator may be configured to include a designation of a counter designated to the respective designated column and/or the designated subset in the column. The second memory device 120-2 may be configured to receive the sent indicators, corresponding to the data batch, from the plurality of designated FIFO components 138 of the first memory device 120-1 and determine from each of the received indicators the designated column of the plurality of columns 122 and/or the designated subset 125 corresponding to the designated FIFO component 138. For example, each of the FIFO components 138 of the first memory device 120-1 may be configured to send a subset of the data batch to a corresponding one of the respective plurality of columns 122 of memory cells of the second memory device 120-2, e.g., as determined by the indicator including a designation of a counter associated with the respective column. As such, the first memory device 120-1 may be configured to assign the indicator of the data value to input 137 of a data stream, e.g., from the number of non-volatile and/or volatile system memory sources, and assign the indicator of the data value to a corresponding one of the plurality of FIFO components, e.g., 138-0, 138-1, ..., 138-X−1.

The second memory device 120-2 may be further configured to store the received indicators in the designated columns 122 of memory cells based on structured indicators, e.g., concatenated indicators, as described elsewhere herein, of the plurality of data values sent from the plurality of designated FIFO components. The second memory device 120-2 may be further configured to contribute, e.g., in combination with a controller 140 and/or a host 510, to generation of a histogram based on the data batch sent by the first memory device 120-1 by changing a numerical value stored by at least one of a plurality of counters 136.

Figure 1C:
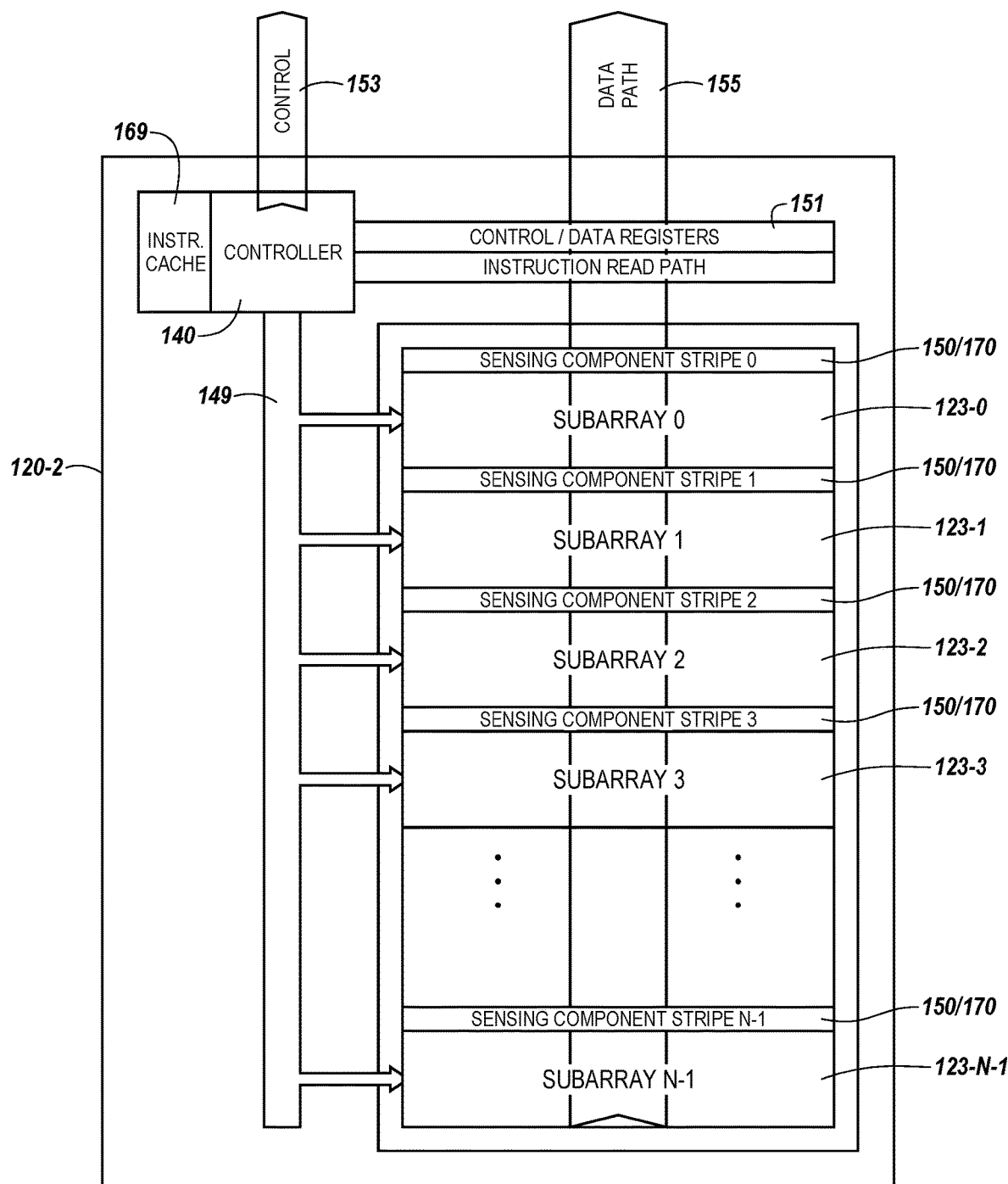
FIG. 1C is a block diagram of a bank of a memory device in accordance with a number of embodiments of the present disclosure.

FIG. 1C is a block diagram of a bank of a memory device in accordance with a number of embodiments of the present disclosure. For example, bank 121 can represent an example bank of a memory device. As shown in FIG. 1C, a bank 121 can include an address/control (A/C) path 153, e.g., a bus, coupled a controller 140. Again, the controller 140 shown in FIG. 1C can, in various embodiments, represent at least a portion of the functionality embodied by and contained in the controller shown at 140 and 540 and described in connection with FIGS. 1B, 1D, and 5.

As shown in FIG. 1C, a bank 121, e.g., included in a second memory device 120-2, may be subdivided into a plurality of subarrays, e.g., subarray 0, subarray 1, ..., subarray N−1 shown at 123-1, 123-2, ..., 123-N−1. The plurality of subarrays may be respectively separated by sensing component stripes 124-0, 124-1, ..., 124-N−1, as shown in FIG. 1B. Each of the subarrays may correspond to an array 130 of memory cells and counters 136 described in connection with FIG. 1B. The sensing component stripes can include sensing circuitry and logic circuitry 150/170, as described herein.

The sensing circuitry 150 can include at least a portion of the functionality embodied by and contained in the sensing circuitry shown at 150, 250 and 550 and described in connection with FIGS. 1A, 2, 3, and 5. The logic circuitry 170 can include at least a portion of the functionality embodied by and contained in the logic circuitry shown at 170 and 570 in FIGS. 1A and 5, respectively, and described in connection with FIGS. 3-5.

Bank 121 can, for example, represent a bank of a memory device 120-2, such one of a plurality of banks (not shown). As shown in FIG. 1C, a bank 121 can include an additional address and control path 153 coupled to the controller 140. Also, as shown in FIG. 1C, a bank 121 can include an additional data path 155 coupled to a plurality of control/data registers 151 in an instruction, e.g., microcode instructions, and read path. The data path 155 may additionally be coupled to a plurality of subarrays, e.g., subarrays 123-1, 123-2, ..., 123-N−1, in a particular bank 121. As shown in the example embodiment of FIG. 1C, a bank 121 can be subdivided into the plurality of subarrays 123-1, 123-2, ..., 123-N−1 and separated by a plurality of sensing component stripes including sensing circuitry and logic circuitry 150/170. In one example, a bank 121 may be divided into sixteen subarrays.

In some embodiments, the controller 140 may be configured to provide instructions (control signals based on commands) and data to a plurality of locations of a particular bank 121 and to the sensing component stripes including the sensing circuitry and logic circuitry 150/170 via a write path 149 and/or the data path 155 with control and data registers 151. For example, the control and data registers 151 can provide instructions to be executed using by the sense amplifiers and the compute components of the sensing circuitry 150 and/or the logic circuitry 170 in the sensing component stripes 124-0, 124-1, . . . , 124-N-1. FIG. 1C illustrates an instruction cache 169 associated with the controller 140 and coupled to the write path 149 to each of the subarrays 123-0, . . . , 123-N-1 in the bank 121.

Figure 1D:
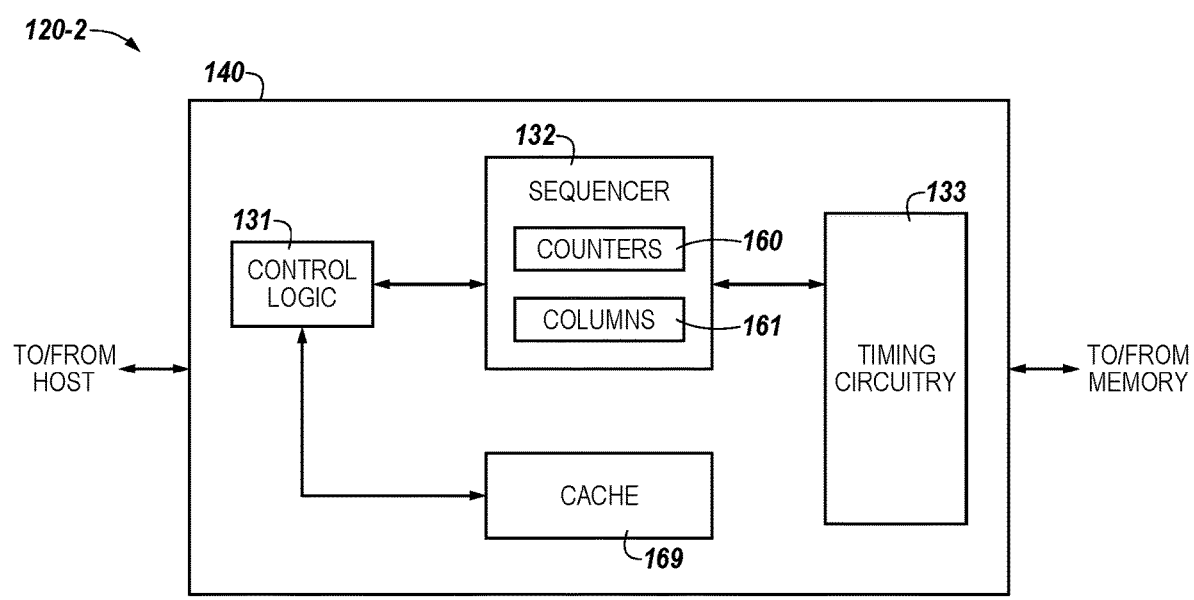
FIG. 1D is a block diagram in greater detail of a controller in accordance with a number of embodiments of the present disclosure.

FIG. 1D is a block diagram in greater detail of the controller 140 and 540 shown in and described in connection with FIGS. 1B-1C and 5, and elsewhere herein, in accordance with a number of embodiments of the present disclosure. In the example shown in FIG. 1D, the controller 140 is shown to include control logic 131, sequencer 132, and timing circuitry 133 as part of a controller 140 of a memory device 120, such as second memory device 120-2, e.g., a PIM capable DRAM device. The second memory device 120-2 can include a controller 140 on each bank of the memory device and the controller can be referred to as a bank process control unit (BPCU).

In the example of FIG. 1D, the second memory device 120-2 may include an interface (not shown) to receive data, addresses, control signals, and/or commands at the memory device 120-2. In various embodiments, the interface may be coupled to a bank arbiter (not shown) associated with the second memory device 120-2. The interface may be configured to receive commands and/or data from a host, e.g., as shown at 510 and described in connection with FIG. 5. The bank arbiter may be coupled to a plurality of banks (not shown) in the second memory device 120-2.

Figure 5:
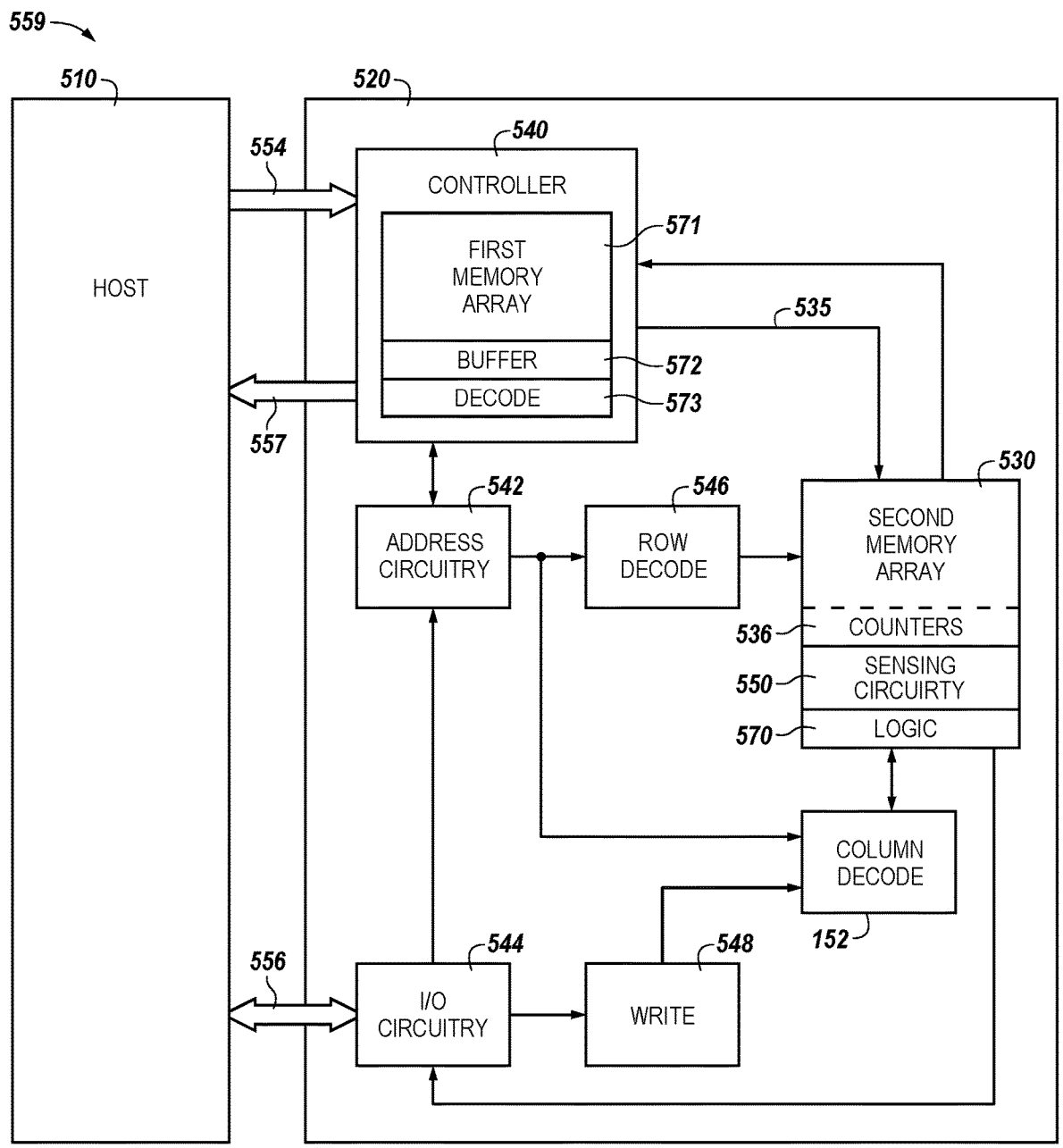
FIG. 5 is a block diagram of an apparatus in the form of a computing system including a number of memory devices in accordance with a number of embodiments of the present disclosure.

In the example shown in FIG. 1D, the control logic 131 may be in the form of a microcode engine responsible for fetching and executing machine instructions, e.g., microcode instructions, from an array of memory cells, e.g., in an array such as first array 171, second array 130, and/or host 510 in FIG. 5. The sequencer 132 may also be in the form of a number of microcode engines and/or ALU circuitry. Alternatively, the control logic 131 may be in the form of a very large instruction word (VLIW) type processing resource and the sequencer 132 and the timing circuitry 133 may be in the form of state machines and/or transistor circuitry.

The control logic 131 may receive microcode instructions from cache 169 and/or host 510 used in performance of the histogramming operations described herein. The microcode can enable performance of the operations that the sequencer 132 receives and executes to cause the memory device 120-2 to perform particular compute and/or logical operations using the sensing circuitry 150 and logic circuitry 170 shown in FIG. 1A and described elsewhere herein. The timing circuitry 133 may provide timing to coordinate performance of the compute and/or logical operations and be responsible for providing conflict free access to the arrays, such as array 130 in FIG. 1A.

In the example shown in FIG. 1D, the sequencer 132 may include and/or be coupled to a counters register 160, e.g., for the counters shown at 136 and 536 and described in connection with FIGS. 1A and 5, respectively, although embodiments are not so limited. For instance, the counters register 160 may be part of the control logic 131 in some embodiments. The counters register 160 can include references to data counts, e.g., numerical values, stored in counters 136 used in conditional changes thereof, e.g., when input of an indicator in an update changes an existing count value in the respective counter and/or in creation of histograms, as described herein. The references in the counters register 160 can be used for access to the operands in compute and/or logical operations, e.g., as performed on the second memory device 120-2. The references in the counters register 160 can be updated by iterating through indexes of the references that access data stored in the counters.

In various embodiments, the controller 140 may include and/or be coupled to a columns register 161, e.g. for the columns shown at 122 and described in connection with FIG. 1B. For example, the columns register 161 may be part of the sequencer 132, as shown in FIG. 1D, although embodiments are not so limited. For instance, the columns register 161 may be part of the control logic 131 in some embodiments. The columns register 161 can include references to the respective columns in each second memory device 120-2 and also can include a row index that is updated by iterating through a number of row indexes where a first row index is used to access data in a first row of a memory array and a second row index is used to access data in a second row of a memory array, and so on. The references can be updated so that compute and/or logical operations can access and use data based on the location of the data in the memory array. In addition, the references can be updated so that operations can access data that is located in a number of locations in the memory array.

In some embodiments, the counters register 160 and/or the columns register 161 may be part of, or operate in association with, the timing circuitry 133 to control timing, e.g., frequency, of the data update and/or histogramming operations described herein. The counters register 160 and/or the columns register 161 may be utilized in directing performance of storing and/or changing a numerical value in a region of memory designated as a number of counters. For example, such a counter may be configured with a data storage functionality and the counters register 160 and/or the columns register 161 may be configured with a counting functionality. The controller 140 may be coupled to sensing circuitry 150 and/or logic circuitry 170, e.g., as described in connection with FIGS. 1A, 1B, and 5. The sensing circuitry 150 may include caches, buffers, sense amplifiers, compute components, logic circuitry, latches, and/or registers associated with arrays of memory cells and/or counters, e.g., the respective columns of memory cells and/or counters, via control lines and data paths shown in FIGS. 1B and 1C. As such, sensing circuitry 150 and logic circuitry 170 shown in FIG. 1A can be associated with, e.g., coupled to, the arrays of memory cells 130 and/or counters 136 using data I/Os. The controller 140 may control regular compute operations for a number of arrays in the second memory device 120-2, such as a read, write, copy, and/or erase operations, etc. Additionally, however, microcode instructions retrieved and executed by the control logic 131 and the microcode function calls received and executed by the sequencer 132 can cause sensing circuitry 150 and/or logic circuitry 170 shown in FIG. 1A to perform logical operations, such as addition, multiplication, etc. In addition, the control logic 131 and the microcode function calls received and executed by the sequencer 132 can cause the sensing circuitry 150 and/or logic circuitry 170 to perform additional logical operations, for example Boolean operations such as AND, OR, XOR, etc., which are more complex than regular read and write operations. Hence, in this memory device 120-2 example, microcode instruction execution, compute operations, and/or logical operations may be performed on the second memory device 120-2.

As such, the control logic 131, sequencer 132, and timing circuitry 133 may operate to generate sequences of operation cycles, e.g., for a DRAM array. In the memory device 120-2 example, each sequence may be designed to perform operations, such as a Boolean logical operations AND, OR, XOR, etc., which together achieve a specific function. For example, the sequences of operations may repetitively perform a logical operation for a half-add operation performed in order to calculate a sum and carry. Each sequence of operations may be fed into a FIFO buffer (not shown) coupled to the timing circuitry 133 to provide timing coordination with the sensing circuity 150 and/or logic circuitry 170 associated with the memory arrays 130 of memory cells, e.g., DRAM arrays, shown in FIGS. 1A and 1B.

In the example memory device 120-2 shown in FIG. 1D, the timing circuitry 133 may provide timing and provide conflict free access to the arrays from, for example, four FIFO queues (not shown). In this example, one FIFO queue may support array computation, one may be for instruction fetch, one for microcode, one for DRAM I/O, and one for SRAM I/O. The timing circuitry 133 may cooperate with the counters register 160 and/or the columns register 161 to change the counters 136 and/or create the histograms. Both the control logic 131 and the sequencer 132 can generate status information, which can be routed back to the bank arbiter via a FIFO interface (not shown). The bank arbiter may aggregate this status data and report it back to a host 510 via the interface.

Figure 2:
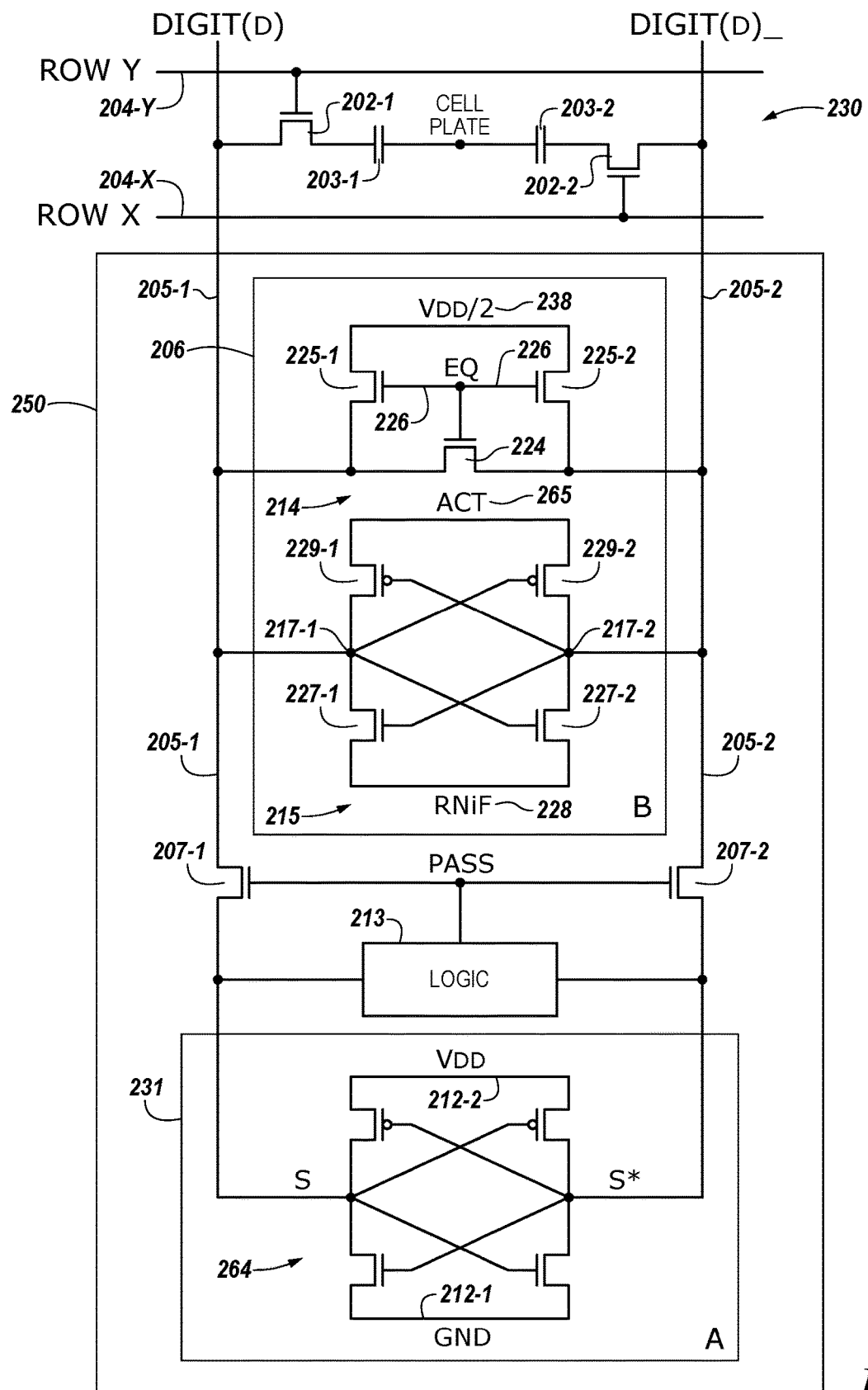
FIG. 2 is a schematic diagram illustrating sensing circuitry of a memory device in accordance with a number of embodiments of the present disclosure.

FIG. 2 is a schematic diagram illustrating sensing circuitry 250 of a memory device, e.g., the second memory device 120-2, in accordance with a number of embodiments of the present disclosure. The sensing circuitry 250 can correspond to sensing circuitry shown at 150 and 550 in FIGS. 1A and 5, respectively, and described in connection with FIGS. 3 and 4 and elsewhere herein.

A memory cell can include a storage element, e.g., capacitor, and an access device, e.g., transistor. For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be use, e.g., 2T2C with two transistors and two capacitors per memory cell. In a number of embodiments, the memory cells may be destructive read memory cells, e.g., reading the data stored in the cell destroys the data such that the data originally stored in the cell is refreshed after being read.

Figure 3:
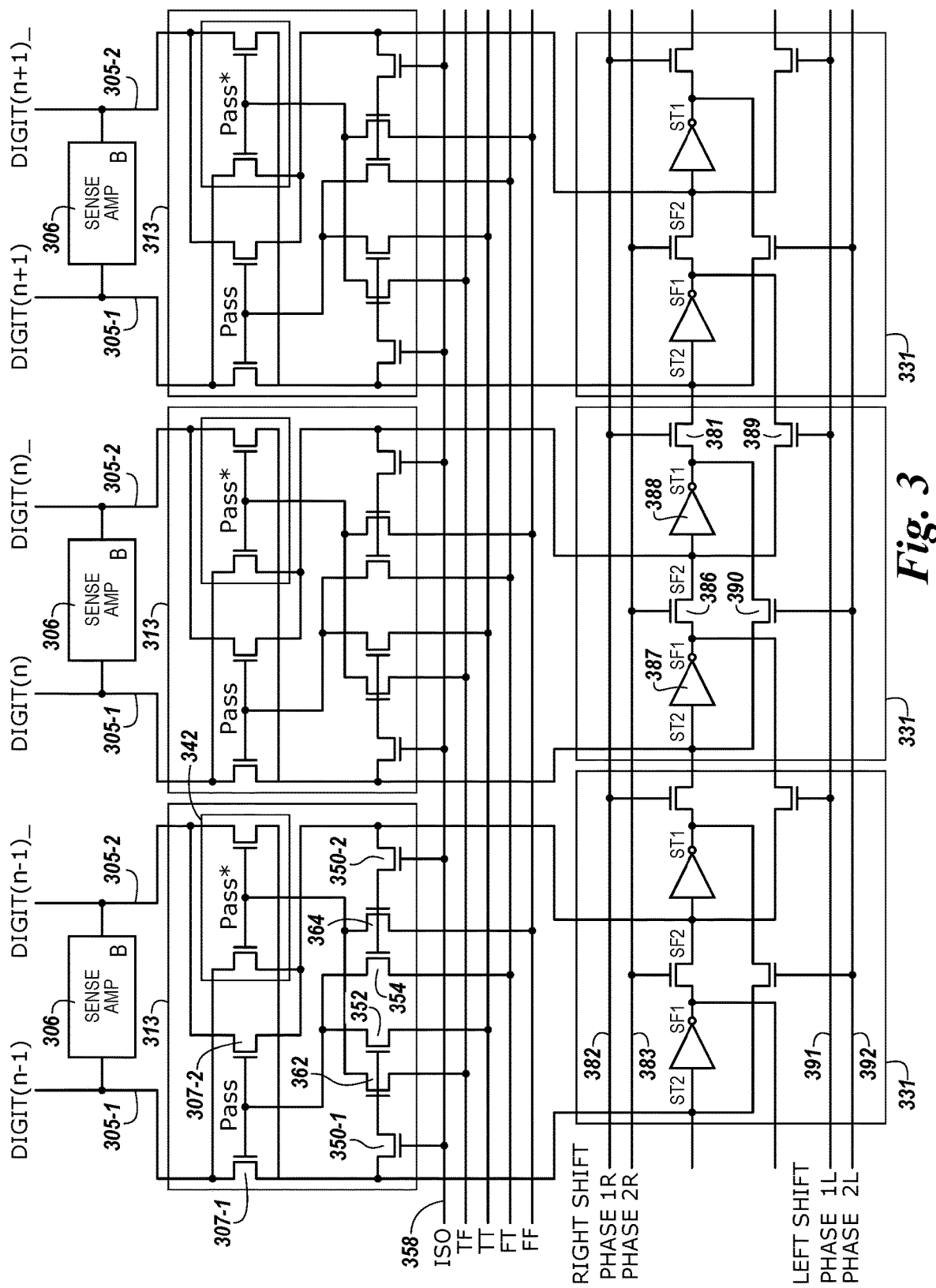
FIG. 3 is another schematic diagram illustrating sensing circuitry of a memory device in accordance with a number of embodiments of the present disclosure.

The cells of the memory array 230 can be arranged in rows coupled by access (word) lines 204-X (Row X), 204-Y (Row Y), etc., and columns coupled by pairs of complementary sense lines, e.g., digit lines DIGIT(D) and DIGIT (D) shown in FIG. 2 and DIGIT(n) and DIGIT(n)_ shown in FIG. 3. The individual sense lines corresponding to each pair of complementary sense lines can also be referred to as digit lines 205-1 for DIGIT (D) and 205-2 for DIGIT (D)_, respectively, or corresponding reference numbers in FIG. 3. Although only one pair of complementary digit lines are shown in FIG. 2, embodiments of the present disclosure are not so limited, and an array of memory cells can include additional columns of memory cells and pairs of complementary digit lines, e.g., $2^{21}$=2,097,152, among other possibilities.

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage, e.g., ground, can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells, e.g., coupled to respective pairs of complementary digit lines. The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value, e.g., logic state, stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 can be a cross coupled latch, e.g., gates of a pair of transistors 227-1 and 227-2, such as n-channel transistors, e.g., NMOS transistors, are cross coupled with the gates of another pair of transistors 229-1 and 229-2, such as p-channel transistors, e.g., PMOS transistors.

In operation, when a memory cell is being sensed, e.g., read, the voltage on one of the digit lines 205-1 (D) or 205-2 (D)_ will be slightly greater than the voltage on the other one of digit lines 205-1 (D) or 205-2 (D)_. An ACT 265 signal and an RNiF 228 signal can be driven low to enable, e.g., fire, the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage, e.g., ground, through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell.

Embodiments are not limited to the sense amplifier 206 configuration illustrated in FIG. 2. As an example, the sense amplifier 206 can be a current-mode sense amplifier and a single-ended sense amplifier, e.g., sense amplifier coupled to one digit line. In addition, embodiments of the present disclosure are not limited to a folded digit line architecture such as that shown in FIG. 2.

The sense amplifier 206 can, in conjunction with the compute component 231, be operated to perform various operations using data from an array, e.g., a DRAM array of the second memory device 120-2, as input. In a number of embodiments, the result of an operation can be stored back to the array without transferring the data via a digit line address access and/or moved between banks without using an external data bus, e.g., without firing a column decode signal such that data is transferred to circuitry external from the array and sensing circuitry via local I/O lines. As such, a number of embodiments of the present disclosure can enable performing operations and compute functions associated therewith using less power than various previous approaches. Additionally, since a number of embodiments eliminate the need to transfer data across local and global I/O lines and/or external data buses in order to perform compute functions, e.g., between memory and discrete processor, a number of embodiments can enable an increased, e.g., faster, processing capability as compared to previous approaches.

The sense amplifier 206 can further include equilibration circuitry 212, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage, e.g., $V_{DD}/2$ 238, where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ 226 enables the transistors 224, 225-1, and 225-2, which effectively shorts digit lines 205-1 (D) and 205-2 (D)_ together and to the equilibration voltage, e.g., $V_{DD}/2$ 238.

Although FIG. 2 shows the sense amplifier 206 including the equilibration circuitry 214, embodiments are not so limited. For example, the equilibration circuitry 214 may be implemented discretely from the sense amplifier 206, implemented in a different configuration than that shown in FIG. 2, or not implemented at all.

As described further below, in a number of embodiments, the sensing circuitry 250, e.g., sense amplifier 206 and compute component 231, can be operated to perform a selected operation and initially store the result in one of the sense amplifier 206 or the compute component 231. For example, the result may be initially stored in one of the sense amplifier 206 or the compute component 231 without transferring data from the sensing circuitry via a local or global I/O line and/or moved between banks without using an external data bus, e.g., without performing a sense line address access via activation of a column decode signal, for instance.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors, e.g., PMOS transistors, included in the secondary latch can have their respective sources coupled to a supply voltage, e.g., $V_{DD}$ 212-2, and the pair of cross coupled n-channel transistors, e.g., NMOS transistors, of the secondary latch can have their respective sources selectively coupled to a reference voltage, e.g., ground 212-1, such that the secondary latch is continuously enabled. The configuration of the compute component 231 is not limited to that shown in FIG. 2, and various other embodiments are feasible and remain within the scope of the present disclosure.

The memory device can include a sensing component stripe, e.g., as shown at 124 and described in connection with FIGS. 1B and 1C, configured to include a number of a plurality of sense amplifiers, e.g., 306 as shown in FIG. 3, and compute components, e.g., 331 as shown in FIG. 3, that can correspond to a number of the plurality of columns, e.g., 205-1 and 205-2 in FIGS. 2 and 305-1 and 305-2 in FIG. 3, of the memory cells.

FIG. 3 is another schematic diagram illustrating sensing circuitry of a memory device in accordance with a number of embodiments of the present disclosure. FIG. 3 illustrates sensing circuitry capable of implementing a number of logical operations, e.g., Boolean operations such as AND, OR, XOR, etc. Performance of logical operations, e.g., Boolean logical operations involving data values, is fundamental and commonly used. Boolean logical operations are used in many higher level operations, e.g., conditionally changing the counts in the counters to enable histogramming operations, as described herein. Consequently, speed and/or power efficiencies that can be realized with improved operations can translate into speed and/or power efficiencies of higher order functionalities.

FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sensing circuitry, e.g., as shown at 150 in FIG. 1A, and the sense amplifier 206 shown in FIG. 2. The compute component 331 shown in FIG. 3 can correspond to the sensing circuitry 150 shown in FIG. 1A and the compute component 231 shown in FIG. 2. The logical operation selection logic 313 shown in FIG. 3 can correspond to operation selection logic 213 shown in FIG. 2.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

In the embodiment illustrated in FIG. 3, the compute components 331 can comprise respective stages, e.g., shift cells, of a loadable shift register configured to shift data values left and right. For example, as illustrated in FIG. 3, each compute component 331, e.g., stage, of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein. In some embodiments, e.g., to limit impact of the circuitry on the chip area, the sensing circuitry may be configured not to support shifting of data to the right or left in the array.

The sensing circuitry shown in FIG. 3 also shows a logical operation selection logic 313 coupled to a number of logic selection input control lines, including ISO, TF, TT, FT, and FF. Selection of a logical operation from a plurality of logical operations is determined from the condition of logic selection control signals on the logic selection input control lines, as well as the data values present on the pair of complementary sense lines 305-1 and 305-2 when the isolation transistors 350-1 and 350-2 are enabled via the ISO control signal 358 being asserted. A data value determined by accessing the pair of complementary sense lines 305-1 and 305-2 can be compared with a count, e.g., numerical value, stored by a respective counter 136 by enabling a number of logical operations to determine whether the count in the counter is to be changed, e.g., by being different from a count previously stored in the counter. In various embodiments, the references in the counters register 160 and/or the columns register 161 may be used as operands in the logical operations comprising the comparison with the count previously stored by the respective counter 136.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1, e.g., having a gate coupled to an ISO signal control line. Gates of logic selection transistors 364 and 354 are coupled to the complementary sense line through isolation transistor 350-2, e.g., also having a gate coupled to an ISO signal control line.

Data values present on the pair of complementary sense lines 305-1 and 305-2 can be loaded into the compute component 331 via the pass gates 307-1 and 307-2. The compute component 331 can, in some embodiments, include a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2, although the result of the implemented logical operation can be dependent on the data value present on the pair of complementary sense lines 305-1 and 305-2 and/or the count, e.g., numerical value, previously stored in a respective counter. For example, the ISO, TF, TT, FT, and FF control signals may select the logical operation to implement directly because the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 306 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated, e.g., high, to OPEN the pass gates 307-1 and 307-2, e.g., conducting, when the ISO control signal line is activated and either the TT control signal is activated, e.g., high, and data value on the true sense line is "1" or the FT control signal is activated, e.g., high, and the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line, e.g., sense line to which the gate of the particular logic selection transistor is coupled, is not high, then the pass gates 307-1 and 307-2 will not be OPENed by a particular logic selection transistor.

The logical operation selection logic signal Pass* can be activated, e.g., high, to OPEN the swap transistors 342, e.g., conducting, when the ISO control signal line is activated and either the TF control signal is activated, e.g., high, and data value on the true sense line is "1," or the FF control signal is activated, e.g., high, and the data value on the complement sense line is "1." If either the respective control signal or the data value on the corresponding sense line, e.g., sense line to which the gate of the particular logic selection transistor is coupled, is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals, e.g., logical operation selection is not dependent on the data value present on the pair of complementary sense lines. Some combinations of the logic selection control signals can cause both the pass gates 307-1 and 307-2 and swap transistors 342 to be OPEN at the same time, which shorts the pair of complementary sense lines 305-1 and 305-2 together. The circuitry enclosed in the box for the logical operation selection logic 313, along with the circuitry described in connection with the logic selection input control lines ISO, TF, TT, FT, and FF, may represent and/or be included in the logic circuitry, e.g., as shown at 170 and 570 in FIGS. 1A and 5, respectively, and described in connection with FIGS. 3-5. In a number of embodiments, the logical operations can be implemented using the sensing circuitry 250 illustrated in FIG. 2, which can be the logical operations summarized in the logic tables shown in FIG. 4.

Figure 4:
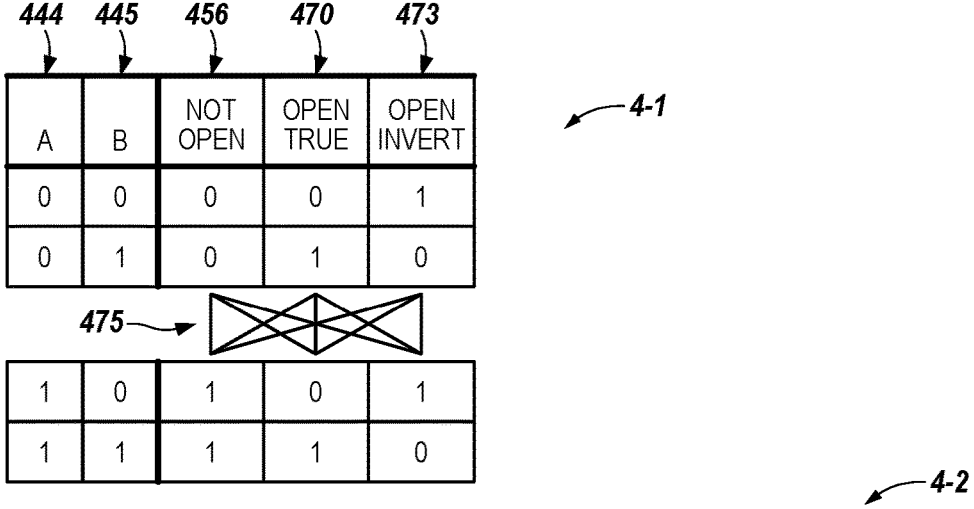
FIG. 4 is a logic table illustrating selectable logical operation results implemented by sensing circuitry in accordance with a number of embodiments of the present disclosure.

FIG. 4 is a logic table illustrating selectable logical operation results implemented by sensing circuitry shown in FIG. 3 in accordance with a number of embodiments of the present disclosure. The four logic selection control signals, e.g., TF, TT, FT, and FF, in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines and/or a count, e.g., numerical value, previously stored in a respective counter, controls the continuity of the pass gates 307-1 and 307-2 and swap transistors 342, which in turn affects the data value in the compute component 331 and/or sense amplifier 306 before and/or after firing. The capability to selectably control continuity of the swap transistors 342 facilitates implementing logical operations involving inverse data values, e.g., inverse operands and/or inverse results, among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals, e.g., TF, TT, FT, and FF, in conjunction with a particular data value present on the pair of complementary sense lines 305-1 and 305-2. The "Not Open" column 456 corresponds to the pass gates 307-1 and 307-2 and the swap transistors 342 both being in a non-conducting condition, the "Open True" column 470 corresponds to the pass gates 307-1 and 307-2 being in a conducting condition, and the "Open Invert" column 473 corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry, e.g., 150 in FIG. 1A, are summarized in Logic Table 4-2 illustrated in FIG. 4, including AND, OR, XOR, etc., logical operations.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447, including the AND logical operation shown at A*B, which is intended to mean A AND B, the OR logical operation shown at A+B, which is intended to mean A OR B, and the XOR logical operation shown at A×B, which is intended to mean A XOR B, among other logical operators.

FIG. 5 is a block diagram of an apparatus in the form of a computing system 559 including a memory device 520 in accordance with a number of embodiments of the present disclosure. As used herein, a memory device 520, a controller 540, a first memory array 571, a second memory array 530, counters 536, sensing circuitry 550, and/or logic 570 might also be separately considered an "apparatus."

In various previous approaches, data may be transferred from a memory array and sensing circuitry, e.g., via a bus comprising I/O lines, to a processing resource such as a processor, microprocessor, and/or compute engine, which may comprise ALU circuitry and/or other functional unit circuitry configured to perform the appropriate operations. However, transferring data from the memory array and sensing circuitry to such processing resource(s) can involve significant time and/or power consumption. Even if the processing resource is located on a same chip as the memory array, significant power can be consumed in moving data out of the array to the compute circuitry, which can involve performing a sense line (which may be referred to herein as a digit line or data line) address access, e.g., firing of a column decode signal, in order to transfer data from sense lines onto I/O lines, e.g., local I/O lines, transferring the data peripheral to the array, which may be transferred to a cache in a host, and providing the data to the peripheral compute circuitry.

In the previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines.

In contrast, in a number of embodiments described herein, sensing circuitry 550 can be used to perform logical operations using data stored in an array of memory cells as inputs and store the results of the logical operations back to the array 530 without transferring data via a sense line address access, e.g., without firing a column decode signal. As such, various compute functions can be performed using, and within, sensing circuitry 550 rather than (or in association with) being performed by processing resources external to the sensing circuitry, e.g., by a processor associated with host 510 and/or other processing circuitry, such as ALU circuitry, located on device 520, e.g., on controller 540 or elsewhere. For example, the sensing circuitry 550 may be configured to perform logical operations on data stored in the second memory array 530 and store the result back to the second memory array 530 without enabling an I/O line, e.g., a local I/O line, coupled to the sensing circuitry 550. Additional logic circuitry 570 can be coupled to the sensing circuitry 550 and can be used in performance of logical operations and/or to store, e.g., cache and/or buffer, results of the logical operations described herein.

The sensing circuitry 550 can be formed on pitch with the memory cells of the second memory array 530. In some instances, circuitry of processing resource(s), e.g., a compute engine, may not conform to pitch rules associated with a memory array. For example, the memory cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which can affect chip size and/or memory density, for example. A number of embodiments described herein can include the control circuitry, the sensing circuitry, e.g., including sense amplifiers, compute components, and/or the logic circuitry being formed on pitch with the memory cells of the array and being configured to, e.g., being capable of performing, compute and/or logical functions, e.g., memory and/or PIM operations, on pitch with the memory cells. The sensing circuitry and logic circuitry can, in some embodiments, be capable of performing data sensing, compute, and/or logical functions and at least temporary storage, e.g., caching, of data local to the array of memory cells.

PIM capable device operations can use bit vector based operations. As used herein, the term "bit vector" is intended to mean a number of bits on a bit vector memory device, e.g., a PIM device, stored in a row of an array of memory cells and/or in sensing circuitry. Thus, as used herein a "bit vector operation" is intended to mean an operation that is performed on a bit vector that is a portion of virtual address space and/or physical address space, e.g., used by a PIM device. In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space.

In some embodiments, a bit vector memory device, e.g., a PIM device capable of performing bit vector operations, may perform logical operations. For example, PIM devices capable of bit vector operations operate on bit vectors. The term "bit vector," in some embodiments, may mean a physically contiguous number of bits on a bit vector memory device, e.g., PIM device, whether physically contiguous in rows, e.g., horizontally oriented, or columns, e.g., vertically oriented, in an array of memory cells. Thus, a "bit vector operation" may mean an operation that is performed on a bit vector that is a contiguous portion of virtual address space, e.g., used by a bit vector operation capable memory device. However, embodiments of a bit vector operation are not so limited. For example, at least some of the sense amplifiers 206 and/or the compute components 231 described herein may not be physically contiguous, e.g., may have one or more other components positioned therebetween, may have half the combination of the sense amplifiers with the compute components formed above the columns of memory cells 122 and half being formed below the columns of memory cells, among other configurations. Such bit vector operations may be enabled, e.g., performed, on each bit of a bit vector, e.g., bit-wise, by a combination of a sense amplifier 206 and a compute component 231, e.g., in a 2T2C configuration, as shown in FIGS. 2 and 3 and described in connection with FIGS. 3 and 4. As the reader will appreciate, while a DRAM memory device configuration and/or a DRAM bit vector operation, e.g., performed by a PIM device, is discussed with regard to some examples presented herein, embodiments are not limited to a DRAM and/or PIM DRAM implementation.

For example, a row of data values in the PIM device may have a bit length of 2,097,152 bits, e.g., corresponding to 2,097,152 memory cells in a 1T1C DRAM configuration or 2,097,152 complementary pairs of memory cells in a 2T2C DRAM configuration. Sensing circuitry 550, as described herein, for such a 2,097,152 bit row may include a corresponding 2,097,152 processing elements, e.g., compute components as described herein, formed on pitch with the sense lines selectably coupled to corresponding memory cells in the 2,097,152 bit row. A compute component in the PIM device may operate as a one bit vector processing resource on a single bit of the bit vector of the row of memory cells sensed by the sensing circuitry 550, e.g., sensed by and/or stored in 2,097,152 sense amplifiers 206 paired with the 2,097,152 compute components 231, as described further in connection with FIGS. 2 and 3, and elsewhere herein. Such a one bit vector operation may be performed with the sensing circuitry 550 including the sense amplifier and a compute component, e.g., along with logical circuitry where the compute component enables performance of the logical operation on the operands. Examples of logical operations can include, but are not limited to, Boolean logical operations AND, OR, XOR, etc.

As such, in a number of embodiments, circuitry external to array 530 and sensing circuitry 550, which can include the logic circuitry, is not needed to perform compute functions as the sensing circuitry 550 can perform the appropriate compute and/or logical operations in order to perform such compute functions without the use of an external processing resource. Therefore, the sensing circuitry 550 may be used to complement and/or to replace, at least to some extent, such an external processing resource (or at least the bandwidth consumption of such an external processing resource).

However, in a number of embodiments, the sensing circuitry 550 may be used to perform operations, e.g., to execute instructions, in addition to operations performed by an external processing resource, e.g., host 510. For instance, the host 510 and/or sensing circuitry 550 may be limited to performing only certain logical operations and/or a certain number of logical operations.

Enabling an I/O line can include enabling, e.g., turning on, a transistor having a gate coupled to a decode signal, e.g., a column decode signal, and a source/drain coupled to the I/O line. However, embodiments are not limited to performing operations using sensing circuitry, e.g., 550, without enabling column decode lines of the array. Whether or not local I/O lines are used in association with performing operations via sensing circuitry 550, the local I/O line(s) may be enabled in order to transfer a result to a suitable location other than back to the array 530, e.g., to an external register for generation of a histogram, as described herein.

The computing system 559 illustrated in FIG. 5 can include a host 510 coupled, e.g., connected, to memory device 520. The memory device 520 may, in some embodiments, include the controller 540, the first memory array 571, e.g., a SRAM array, and the second memory array 530, e.g., a DRAM array, among other components shown in FIG. 5 and described elsewhere herein. Host 510 can be a host system such as a personal laptop computer, a desktop computer, a tablet computer, a digital camera, a smart phone, or a memory card reader, among various other types of hosts. Host 510 can include a system motherboard and backplane and can include a number of processing resources, e.g., one or more processors, microprocessors, or some other type of controlling circuitry. The computing system 559 can include separate integrated circuits or both the host 510 and the memory device 520 can be on the same integrated circuit. The computing system 559 can be, for instance, a server system and/or a high performance computing (HPC) system or a portion of either. Although the example shown in FIG.

5 illustrates a system having a Von Neumann architecture, embodiments of the present disclosure can be implemented in non-Von Neumann architectures, which may not include one or more components, e.g., CPU, ALU, etc., often associated with a Von Neumann architecture.

For clarity, description of the computing system 559 has been simplified to focus on features with particular relevance to the present disclosure. For example, in various embodiments, the second memory array 530 can be a DRAM array, SRAM array, STT RAM array, PCRAM array, TRAM array, RRAM array, NAND flash array, and NOR flash array, for instance. The second memory array 530 can include memory cells arranged in rows coupled by access lines (which may be referred to herein as word lines or select lines) and columns coupled by sense lines (which may be referred to herein as data lines or digit lines). Although a single second memory array 530 is shown in FIG. 5, embodiments are not so limited. For instance, memory device 520 may, in some embodiments, include a number of second memory arrays 530 in a number of subarrays 123 of a bank 121 of DRAM cells, NAND flash cells, etc., e.g., as shown and described in connection with FIG. 1C. Alternatively or in addition, memory device 520 may, in some embodiments, include a number of subsets 125 in columns of a second memory array 530 in bank 121, as described herein.

The memory device 520 can include address circuitry 542 to latch address signals provided over a data bus 556, e.g., an I/O bus from the host 510, by I/O circuitry 544, e.g., provided to external ALU circuitry and to DRAM DQs via local I/O lines and global I/O lines. As used herein, DRAM DQs can enable input of data to and output of data from a bank, e.g., from and/or to the controller 540 and/or host 510, via a bus, e.g., data bus 156 and/or 556. During a write operation, a voltage (high=1, low=0) can be applied to a DQ, e.g., a pin. This voltage can be translated into an appropriate signal and stored in a selected memory cell. During a read operation, a data value read from a selected memory cell can appear at the DQ once access is complete and the output is enabled, e.g., by the output enable signal being low. At other times, DQs can be in a high impedance state, such that the DQs do not source or sink current and do not present a signal to the system. This also may reduce DQ contention when two or more devices, e.g., banks, share the data bus.

Status and exception information can be provided from the controller 540 on the memory device 520 to the host 510 through, for example, a bus 557, e.g., a high speed interface (HSI) out-of-band (OOB) bus. The bus 557 can be used by the host 110 to dispatch commands, e.g., PIM commands, to a plurality of memory devices 520-1, . . . , 520-N (not shown) to store those program instructions within a given bank of a memory device.

Address signals are received through address circuitry 542 and decoded by a row decoder 546 and a column decoder 552 to access the memory array 530. Data can be sensed, e.g., read, from memory array 530 by sensing voltage and/or current changes on sense lines, e.g., digit lines in FIGS. 2 and 3, for example, using a number of sense amplifiers of the sensing circuitry 550. A sense amplifier can read and latch data values from a page, e.g., a row, of data from the memory array 530. Additional compute components, e.g., as shown at 231 and 331 and described in connection with FIGS. 2 and 3, can be coupled to the sense amplifiers and can be used in combination with the sense amplifiers to sense, store, e.g., cache and buffer, perform compute functions, e.g., compute and/or logical operations, on and/or to move data. The I/O circuitry 544 can be used for bi-directional data communication with host 510 over the data bus 556, e.g., a 64 bit wide data bus. The write circuitry 548 can be used to write data to the first memory array 571 and/or the second memory array 530.

Controller 540, e.g., including bank control logic 131, sequencer 132, and timing circuity 133 as a BPCU as described in connection with FIG. 1D, can decode signals, e.g., commands, provided by control bus 554 from the host 510. These signals can include chip enable signals, write enable signals, and/or address latch signals that can be used to control operations performed on the memory array 530, including data sense, data store, data movement, data compute (PIM), data logic (PIM), data count, data read, data write, and/or data erase, among other operations, associated with, for example, changing data category values, e.g., for generating a histogram to reveal frequencies of particular data values in a set of data. Control circuitry having instructions, e.g., stored in hardware, such as an application-specific integrated circuit (ASIC), firmware, and/or software embodiments, can be associated with the controller 540. In various embodiments, the controller 540 can be responsible for issuing instructions from the host 510 and accessing the first memory array 571 and/or the second memory array 530. The controller 540 can be a state machine, a sequencer, or some other type of controller. In embodiments configured for shift operations, the controller 540 can control shifting data, e.g., right or left, in a row of an array, e.g., second memory array 530.

Examples of the sensing circuitry 550 are described in connection with FIGS. 2 and 3. For instance, in various embodiments, the sensing circuitry 550 can include a number of sense amplifiers and/or a number of compute components. A compute component may serve as an accumulator and can be used to perform operations as directed by a controller 540 and/or a respective section controller (not shown) of each section, e.g., on data associated with complementary sense lines. In some embodiments, a compute component can be coupled to each sense amplifier, e.g., as shown at 231 and 206, respectively, in FIG. 2, within the sensing circuitry 550 in each respective sensing component stripe coupled to a second memory array 530, e.g., in sensing component stripes 124 coupled respectively to subsets 125-0, 125-1, . . . , 125-N–2, 125-N–1 shown in and described in connection with FIG. 1B and elsewhere. However, embodiments are not so limited. For example, in some embodiments, there may not be a 1:1 correlation between the number of sense amplifiers and compute components. For example, there may be more than one sense amplifier per compute component or more than one compute component per sense amplifier, which may vary between sections, banks, etc.

In a number of embodiments, the sensing circuitry 550 can be used to perform operations using data stored in second memory array 530 as input and participate in movement of the data for read, write, compute, logical, copy, transfer, and/or storage operations to a different location in the second memory array 530 without transferring the data via a sense line address access, e.g., without firing a column decode signal. As such, various compute functions (PIM operations) can be performed using, and within, the sensing circuitry 550 rather than (or in association with) being performed by processing resources external to the sensing circuitry 550, e.g., by a processor associated with host 510 and other processing circuitry, such as ALU circuitry, located on device 520, such as on controller 540 or elsewhere.

Accordingly, as described herein, a computing system, e.g., as shown at 559 in FIG. 5, can include a memory device, e.g., 520, that can include an array, e.g., second memory array 530, having a plurality of columns of memory cells, e.g., as shown at 122 and described in connection with FIG. 1B. Each of the respective columns of memory cells can include a plurality of designated subsets of memory cells, e.g., as shown at 125-0, 125-1, . . . , 125-N−2, 125-N−1 and described in connection with FIG. 1B. The array 530 can include a counter, e.g., a designated counter among the plurality of counters shown at 136 and described in connection with FIG. 2B and elsewhere herein, corresponding to one of the plurality of designated subsets of memory cells. A counter, in some embodiments, may be circuitry configured to count entries of data values, e.g., as determined by a number of received indicators, as changes to a stored numerical value. A counter, in some embodiments, may be a designated region of memory that stores and/or changes a numerical value as provided by input from the PIM circuitry, e.g., the sensing circuitry 550 and/or the logic circuitry 570 shown in FIG. 5. For example, such a counter may be configured with a data storage functionality and configured without a counting functionality.

The memory device 520, e.g., the second memory array 530, is configured to receive input, e.g., via the interface shown at 135 and 525 in FIGS. 1 and 5, respectively, and described in connection with FIG. 1A, corresponding to a data batch. The input can include an indicator, e.g., a four bit indicator of a data value as described herein, although the number of bits is not limited to four, corresponding to a designator of the one of the plurality of designated subsets of memory cells to be conditionally updated.

The memory device 520, e.g., the second memory array 530, can be further configured to change a count, e.g., numerical value, previously stored by the counter 136 corresponding to the one of the plurality of designated subsets of memory cells. In various embodiments, the numerical value in the counter can be changed using the sensing circuitry shown at 150 and 550 and described in connection with FIGS. 1 and 5 along with the logic circuitry shown at 170 and 570 in FIGS. 1A and 5, respectively, and described in connection with FIGS. 3 and 4 and elsewhere herein.

In some embodiments, a controller, e.g., as shown at 140 and 540 and described in connection with FIGS. 1B-1D and 5, may be formed, e.g., positioned, on a same chip as the array, e.g., the second memory array 530, the counters 136, the sensing circuitry 550, and/or the logic circuitry 570. The on-chip controller may be configured to direct a counter to change the numerical value.

The received data batch can include indicators, e.g., four bit indicators, of data values in an order that corresponds to an order of the respective columns 122 of memory cells. For example, the indicators of a plurality of data values stored by a plurality of designated FIFO components, e.g., as shown at 138-0, 138-1, . . . , 138-X−1 in the array 171 of the first memory device 120-1 and described in connection with FIG. 1A, may be concatenated to be sent as the data batch, e.g., to the second memory device 120-2. As used herein, concatenated is intended to mean that each of the indicators, e.g., the bits thereof, is linked together in series, e.g., by the first memory device 120-1, the buffer 172, and/or the address latch 141, to be sent to the second memory device 120-2. An order of the series of concatenated indicators may correspond to the respective order of the columns in the second memory device in which each of the indicators is to be stored as the data batch.

As described herein, changing data category values, e.g., numerical values stored in a particular counter for a particular data category, may utilize one FIFO 138 designated per column 122 in the memory array. In some embodiments, as described herein, a single FIFO may be designated to a plurality of subsets, e.g., as shown at 125-0, 125-1, . . . , 125-N−2, 125-N−1, in one column. Alternatively or in addition, a single FIFO may be designated to a plurality of columns to save area in some embodiments.

In an embodiment in which there are $2^{21}=2,097,152$ columns in an array of the second memory device, e.g., DRAM array, the designated FIFO components, e.g., FIFOs, in an array of the first memory device, e.g., SRAM array, may utilize 1 mebibyte (MiB), e.g., $2^{20}$ bytes=1,048,576 bytes, or 8,388,608 bits, of memory for designated FIFOs being configured, e.g., enabled, to store one of the four bit indicators until becoming full. Embodiments in which the designated FIFOs are configured to store four of the four bit indicators until becoming full may utilize 4 MiB. In some embodiments, at least one FIFO being full of indicators may prompt sending the indicators from all of the FIFOs to the second memory device, e.g., as opposed to sending the indicators based on elapse of a set time period.

When at least one of the FIFOs is filled with its enabled number of indicators, a determination may be made that the indicators stored in all of the FIFOs are not to be sent, e.g., by the set time period not having yet elapsed, among other possible determinants. Accordingly, at least one of the indicators in at least one of the full designated FIFOs may be discarded before the indicators are sent as the data batch to the second memory device 120-2. The indictors may be discarded in various ways, which, in combination with a determination of how many indicators, e.g., total and/or per FIFO, may be discarded, may determine how inexact the numerical values stored in the counters and/or a resulting histogram may be. For example, the more indicators discarded, the more inexact the stored numerical values and resulting histograms may be. The indicators for a full FIFO may, in various embodiments, be discarded by: not determining and/or assigning new indicators; disabling storage of new indicators; overwriting previously stored indicators; and/or blocking some or all data sources, e.g., the number of non-volatile and/or volatile system memory sources (not shown); among other possibilities for discarding indicators for a full FIFO.

For each data update from the number of non-volatile and/or volatile system memory sources, a representative number of indicators for each data category may be determined by the first memory device 120-1 and assigned, e.g., as a four bit indicator, to the FIFO representing the appropriate data category and the respective designated column in the second memory device 120-2. As described herein in connection with FIG. 1B, a column may be configured with 15 subsets, e.g., 125-0, 125-1, . . . , 125-14, to store indicators based upon data updates. In some embodiments, a 16th subset, e.g., 125-15, may, for example, be configured to store a special indicator to indicate an empty FIFO. The special indicator, e.g., four binary bits of 0000, may be an indicator of a null value having been sent by the first memory device 120-1 to indicate that the null value for a designated subset in the column is to be stored in designated subset 125-N−1. A subset in which the special indicator of a null value may be stored may, in various embodiments, have a different number of rows and/or memory cells per column. In some embodiments, indicators may be configured as five bits, e.g., instead of four bits. The extra bit may be utilized to indicate lack of an indicator in a corresponding empty FIFO. As described elsewhere herein, storage of the null value in a subset may correspond to a counter not being associated with that subset. In some embodiments, another subset, e.g., 125-15, also may be configured to store indicators based upon data updates, e.g., as described in connection with the subsets 125-0, 125-1, . . . , 125-14.

The first memory device 120-1, e.g., a SRAM device, may include a first array 171, e.g., a SRAM array, having a plurality of FIFO components, e.g., 138-0, 138-1, . . . , 138-X−1, although embodiments are not so limited. In some embodiments, an array of FIFOs may be positioned on a chip that is not formed in a SRAM configuration, e.g., including an array of latch and/or flip-flop circuitry. The first memory device 120-1 may be configured to store an indicator of a data value, e.g., where the indicator indicates that the data value is in one of a plurality of data categories, in a designated FIFO component corresponding to the one of the plurality of data categories, e.g., a designated column in the second memory device 120-2. The first memory device 120-1 device may be further configured to send indicators of a plurality of data values stored by a plurality of designated FIFO components as a data batch. In various embodiments, each of the plurality of designated FIFOs may be configured to store one indicator or a plurality of indicators at a time. As such, each of the plurality of designated FIFOs may be configured to send one indicator or a plurality of indicators at a time as the data batch. In some embodiments, a determination of whether to send one indicator or a plurality of indicators at a time from each FIFO may correspond to whether each of the plurality of designated FIFOs is configured to send one indicator or a plurality of indicators at a time.

The second memory device 120-2 may, in some embodiments, be a DRAM device that includes a DRAM array 130 having a plurality of columns 122 of memory cells. In some embodiments, each of the respective columns of memory cells may include a plurality of designated subsets of memory cells, e.g., 125-0, 125-1, . . . , 125-N−2, 125-N−1. The DRAM device may be configured to receive, e.g., as indicated by interface 135 in FIG. 1A, the sent indicators, corresponding to the data batch, from the plurality of designated FIFO components 138 of the SRAM device. The DRAM device may be further configured to store each of the received indicators in a designated subset of the plurality of subsets of memory cells in each of the plurality of columns 122. For example, each of the received indicators may be individually stored in a different subset in the column, e.g., of subsets 125-0, 125-1, . . . , 125-N−2, 125-N−1. The second memory device 120-2 may, in various embodiments, include a counter, e.g., one of the plurality of counters 136, configured to document, e.g., record and/or count, a number of changes to the one of the plurality of data categories in the one of the plurality of designated subsets of memory cells in the DRAM array. In some embodiments, an indicator may correspond to a number of rows for storage of the indicator in the second memory device 120-2, e.g., four rows intersecting a column and/or subset of the column for storage of four bits of an indicator.

The indicators in a data batch received by the DRAM device may, in various embodiments, be at least temporarily stored in memory other than the designated subsets of memory cells, e.g., 125-0, 125-1, . . . , 125-N−2, 125-N−1, just described. Such memory may be a different type of memory, e.g., other than DRAM. The indicators in the data batch may be temporarily stored, for example, in registers (not shown) in the PIM prior to movement to the designated columns and/or designated subsets in the DRAM array. The memory other than the designated subsets of memory cells may, for example, have a different number of rows and/or memory cells, e.g., per column.

The indicator of the data value stored by the designated FIFO component 138 may designate a counter 136 associated with the one of the plurality of designated subsets in a designated column 122 of memory cells in the DRAM array. Each of the indicators received from the SRAM device may, in some embodiments, include a plurality of bits, e.g., four bits, corresponding to a designation of the designated subset of the plurality of subsets of memory cells, e.g., 125-0, 125-1, . . . , 125-N−2, 125-N−1, associated with the designated counter 136. A data value, e.g., four bits, corresponding to the indicator may be stored by the one of the plurality of designated subsets of memory cells in the designated column of memory cells.

The DRAM device may be coupled, e.g., as shown at 135 and 535, to the SRAM device. The DRAM device may include a second memory array 530 including the plurality of columns of memory cells. Each of the respective columns of memory cells can include the plurality of designated subsets of memory cells, e.g., 125-0, 125-1, . . . , 125-N−2, 125-N−1. A first counter of the plurality of counters 136 may be associated with a respective first designated subset, e.g., subset 125-0, of memory cells in each of the plurality of columns 122 and a second counter of the plurality of counters 136 may be associated with a respective second designated subset, e.g., subset 125-1, of memory cells in each of the plurality of columns. For example, each of the designated subsets in each of the plurality of columns may individually be associated with a separate counter. In various embodiments, each separate counter may be operatively associated with and/or physically associated with, e.g., coupled to, a designated subset in each of the plurality of columns. Accordingly, in embodiments where there are 15 designated subsets in each column, e.g., subsets 125-0, 125-1, . . . , 125-14, in addition to the 16th subset, e.g., subset 125-15 configured to store the special indicators for the null value, there may be $15 \times 2^{21} = 31{,}457{,}280$ of the counters 136 per bank 121 of the DRAM device, e.g., the second memory array 530. In some embodiments, subset 125-15 may be configured for temporary storage of the indicators in a data batch prior to movement to the designated columns and/or designated subsets in the DRAM array.

The DRAM device may be configured to change a numerical value stored by each of the first counters for the first designated subset, e.g., subset 125-0, in each of the plurality of columns to a first numerical value to enable generation of a first histogram of a first data batch using the first numerical value stored by each of the first counters. The DRAM device may be further configured to change a numerical value stored by each of the second counters for the second designated subset, e.g., subset 125-1, in each of the plurality of columns to a second numerical value to enable generation of a second histogram of a second data batch using the second numerical value stored by each of the second counters.

Designating the numerical values as a first numerical value and a second numerical value is intended to distinguish the numerical values from each other and not to indicate that the numerical values are necessarily different quantities. For example, in some circumstances, the first numerical value and the second numerical value both may have been changed to the same quantity of indicators, e.g., both having a numerical value of 1, 2, . . . , N, etc.

The DRAM device may be further configured to change the stored first numerical value in each of the first counters for the first designated subset, e.g., subset 125-0, based on a first data batch update received from the SRAM device to enable generation of an updated third histogram. The DRAM device may be further configured to change the stored second numerical value in each of the second counters for the second designated subset, e.g., subset 125-1, based on a second data batch update received from the SRAM device to enable generation of an updated fourth histogram. For example, a particular counter, e.g., the first counter and/or the second counter, in addition to other possible counters, can be changed repeatedly based on a plurality of batch updates. In various embodiments, the first data batch and the second data batch may be received essentially simultaneously or sequentially. Similarly, the first data batch update and the second data batch update may be received essentially simultaneously or sequentially. Accordingly, the first histogram and the second histogram may be generated essentially simultaneously or sequentially, similar to the updated third histogram and the updated fourth histogram.

In some embodiments, the computing system 559 may include a host 510 configured to transmit a request to generate a histogram to a controller, e.g., as shown at 140 and 540. The controller may be positioned on a same chip as at least one of the SRAM device and/or the DRAM device. The controller may be further configured to transmit a number of requests for essentially simultaneous, e.g., parallel, or sequential creation of histograms to a plurality of subarrays, e.g., subarrays shown at 123-1, 123-2, . . . , 123-N−1 and described in connection with FIG. 1C. Each of the subarrays may be configured as described herein with a sensing component stripe including sensing circuitry 150 and/or logic circuitry 170 configured to change data category values in order to contribute to creation of the requested number of histograms.

In various embodiments, one and/or all of the indicators in each of the plurality of FIFOs may be released, e.g., periodically and/or when at least one of the FIFOs is full, in order to be sent to the second memory device 120-2. These indicators may be concatenated, e.g., including inserting the special indicator to indicate lack of other indicators in empty FIFOs, in the order of the columns in the second memory device in which each of the indicators is to be stored. The concatenation of the indicators may be performed by a concatenation component (not shown) before, during, or after the release of the indicators from their respective FIFOs. Concatenation of the indicators may, for example, produce a concatenated series of 1 MiB of data, e.g., $2^{21}$ FIFOs each storing one indicator at four bits each=1,048,576 bytes, or 8,388,608 bits, of data.

The concatenated series of data can be sent, e.g., as one bit of each four bit indicator value for each of four rows in a column of the second memory array 530, to the second memory device 120-2 in one block in a vertically oriented format. As described in connection with FIG. 1A, the concatenated series of data can be converted, e.g., from the horizontally oriented format to a vertically oriented format or vice versa in various embodiments, for storage in the columns of the second memory array 530. For example, the output 139 from the FIFO components may be sent to a buffer, e.g., as shown at 172 and 572 in FIGS. 1A and 5 and described in connection with FIG. 1A, that may be configured to perform a corner turn operation on the concatenated bit sequences of the indicators in preparation for storage of the indicators in the memory cells of the designated columns.

In various embodiments, decode circuitry 573 may be associated with a corner turn buffer 572. The decode circuitry 573 may be used to perform a corner turn on data stored in a plurality of memory cells of one memory to a different memory, e.g., from a SRAM array 571 to a DRAM array 530. For example, data elements (e.g., bytes, words, etc.) can be stored in a plurality of memory cells and/or FIFO components 138 in the SRAM array coupled to a same access line, e.g., word line, in a horizontally oriented format. The data elements may be moved to the DRAM array 530 to be stored in a plurality of memory cells corresponding to a same column, e.g., same sense line and/or pair of complementary sense line, in a vertically oriented storage format.

The decode circuitry 573 can be used to perform an N-bit, e.g., four bit, corner turn, such as for the four bit indicators described herein. The decode circuitry 573 described herein may include a number of multiplexers (not shown) used to perform address modifications on data elements written to a buffer 572 in association with performing the corner turn operation, and a number of multiplexers (not shown) to perform address modifications on data read from the buffer 572 in association with performing the corner turn operation. The decode circuitry may include a read counter (not shown) that can be used to change respective read addresses, including a marker as a least significant read address bit, a marker as a next to least significant read address bit, through a marker as a most significant read address bit in association with performing a corner turn operation. The decode circuitry 573 also may include a write counter (not shown) that can be used to change respective write addresses, including a first marker as a least significant write address bit, a marker as a next to least significant write address bit, through a marker as a most significant write address bit in association with performing the corner turn operation.

As described elsewhere herein, each indicator may correspond to a designation, e.g., a number, an address, etc., of a particular counter 536 associated with each column and/or subset of memory cells in the column of the second memory array 530. When the indicators are stored in four rows of the second memory array 530, the PIM circuitry, e.g., the sensing circuitry 550 and/or the logic circuitry 570 shown in FIG. 5 and described elsewhere herein, may compare the updated number of indicators for each column and/or subset of memory cells in the column to the numerical values stored in a counter, e.g., the counters 536 shown in FIG. 5 and described elsewhere herein. s Such a comparison can determine whether a difference exists between the number of, e.g., one or more, indicators stored in a particular column and/or in particular subsets in the column and the corresponding numerical value previously stored in a respective counter associated with the particular column and/or one of the subsets in the column. In some embodiments, the sensing circuitry 550 and/or logic circuitry 570 can be configured to perform a logical operation on a data value, e.g., an indicator, stored by a column and/or one of the plurality of designated subsets of memory cells to determine whether a result equals a set value, as described further herein. The designated counter may, in various embodiments be associated with, e.g., adjacent and/or otherwise assigned to, and/or coupled, e.g., operatively connected, to the particular column and/or one of the subsets in the column.

The indicators may be stored, e.g., conditionally updated, by the one of the plurality of designated subsets of memory cells, e.g., 125-0, 125-1, . . . , 125-N−2, 125-N−1, in each of the respective columns of memory cells in the order of the received data batch. To be conditionally updated can include the one of the plurality of designated subsets of memory cells in each of the respective columns of memory cells being updated based on a correspondence of a number of bits in the indicator with a designation of the counter. For example, the four bits of the indicator can correspond to a designation of a particular counter 136 associated with and/or coupled to the position of the designated subset of memory cells in the particular column 122 to which the indicator is to be written.

As described herein, the plurality of columns of memory cells, e.g., in the second memory array 530 shown in FIG. 5, corresponds to a respective plurality of categories of data. The computing system 559 is configured to generate a histogram based on a plurality of numerical values, each respective numerical value corresponding to one of the plurality of categories of data stored by the counter 136 corresponding to the one of the plurality of designated subsets of memory cells. As further described herein, the second memory array 530, in various embodiments, further includes sensing circuitry 550 and/or logic circuitry 570 coupled to the array. The sensing circuitry 550 and/or logic circuitry 570 can, for example, be configured to perform the logical operation on the data value stored by the one of the plurality of designated subsets to determine whether the result equals the set value. The sensing circuitry 550 and/or logic circuitry 570 can be further configured to determine whether the numerical value stored by the counter 136 corresponding to the one of the plurality of designated subsets of memory cells is to be changed based on the result of the logical operation.

The pseudocode shown below represents instructions to determine whether the count, e.g., numerical value, stored in a counter of the plurality of counters 136 is to be changed, each counter corresponding to one of the plurality of columns 122 and/or one of the plurality of designated subsets 125 of memory cells in a column. For columns intersecting with, for example, 32 rows of memory cells and/or 15 subsets, each subset intersecting with 32 rows of memory cells, a counter corresponding to, e.g., associated with and/or coupled to, the column and/or the subset may be a 32 bit counter.

An example of pseudocode associated with performing a logic function, e.g., a logical operation, using sense amplifiers 206 and/or compute components 231 to update a row can be summarized as follows:

1. Deactivating EQ;
2. Applying function lines;
3. Opening row and fire sense amplifiers 206 and/or compute components 231;
4. Closing row;
5. Equilibrating sense amplifiers 206 and/or compute components 231.

In the pseudocode summary shown above, "Deactivating EQ" indicates that an equilibration signal, e.g., as described in connection with FIG. 2, 231 is disabled at $t_1$ corresponding to a first group of sense amplifiers 206 and compute components 231 and a second group of sense amplifiers 206 and compute components 231. As such, at $t_1$ the voltage can be $V_{DD}/2$ on the complementary sense lines, e.g., digit lines 305-1 and 305-2 shown in and described in connection with FIG. 3. "Applying function lines can refer to activating appropriate control signals, e.g., FF 476, FT 477, TF 478, and TT 479 shown in and described in connection with Logic Table 4-2 illustrated in FIG. 4, coupled to the first group of sense amplifiers 206 and compute components 231 and the second group of sense amplifiers 206 and compute components 231 to perform a number of selected operations. Such selected operations can include performing one or more, e.g., a number of half-add operations, Boolean operations, and/or shift operations, as described herein. As such, at $t_2$ a function signal may activate appropriate control signals corresponding to a selected operation.

Accordingly, the first pseudocode shown below is intended to be iterated for each of the plurality of counters 136 to determine for which column and/or which subset in the column the respective numerical value previously stored in the designated counter is to be changed. The determination of whether to change the previously stored numerical value for each designated counter can be based upon whether a result of the pseudocode iteration equals a set value, e.g., constant i, such as 0 or 1 in binary. The first and second pseudocodes shown below are each presented by way of example and not by way of limitation. For example, other pseudocode sequences may be utilized to achieve the intended results and remain within the scope of the present disclosure.

A first pseudocode may be used to compare the four bit indicator data in rows $r_0$, $r_1$, $r_2$, and $r_3$ with constant k, e.g., a binary number from which bits may be extracted, using the sense amplifiers 206 and compute components 231 described herein. The first pseudocode can be a logical compare operation performed by:

1. Setting all coupled sense amplifiers 206 to a set binary value, e.g., 1;
2. Loading sense amplifiers 206 into the compute components 231;
3. Equilibrating sense amplifiers 206;
4. For each j from 0 to 3;
  a. Loading row $r_j$ individually into sense amplifiers 206;
  b. If bit j of the constant k equals i, e.g., bit j of constant k equals 1;
    a. Performing AND operation for sense amplifier 206 into compute component 231;
  c. If bit j of the constant k does not equal i, e.g., bit j of constant k equals 0;
    a. Performing AND operation from an inverse (INV) of the bit value in the sense amplifier (ANDINV) into compute component 231;
  d. End if;
  e. Equilibrating sense amplifiers 206; and
5. End for.

The result from the above comparison can be stored in the compute components 231. The result can be used as an initial value for an iteration of the second pseudocode shown below to change the numerical value stored in the designated counter, starting with the least significant bit stored on the designated counter. The second pseudocode shown below can be iterated 32 times, once on each bit, e.g., from the least significant bit to the most significant bit, to determine the numerical value stored in a 32 bit counter to be conditionally changed, e.g., changed to an updated numerical value. The second pseudocode shown below can be used to perform a logical operation, including a half-add operation, between row r and compute component 231 with a sum in row r and a carry in compute component 231. The second pseudocode can be a logical operation performed by:

1. Loading row r into sense amplifiers 206;
2. Closing row r;
3. Performing first XOR operation for sense amplifiers 206 into compute components 231;

4. Equilibrating sense amplifiers 206;
5. Performing OR operation for result of the first XOR operation into row r by;
    a. Setting, e.g., setting to 1, sense amplifiers 206 whose corresponding compute components 231 equal a constant i, e.g., when the result equals 1;
    b. Connecting sense amplifiers 206 to row r;
    c. Firing sense amplifiers 206 to copy data from row r into the sense amplifiers that are equilibrated and copy the resulting sense amplifier bit values into row r;
6. Performing second XOR operation for sense amplifiers 206 into compute components 231;
7. Equilibrating sense amplifiers 206;
8. Performing ANDINV operation for result of the second XOR operation into row r by;
    a. Clearing, e.g., setting to 0, sense amplifiers 206 whose corresponding compute components 231 equal a constant i, e.g., when the result equals 1;
    b. Connecting sense amplifier 206 to row r;
    c. Firing sense amplifier 206 to copy data from row r into the sense amplifiers that are equilibrated and copy the resultant sense amplifier bit value into row r;
and
9. Equilibrating sense amplifiers 206.

Accordingly, the second memory device 120-2, e.g., a DRAM device, can include sensing circuitry 550 and logic circuitry 570, as described herein, that is selectably coupled to a second memory array 530, e.g., a DRAM array. The sensing circuitry 550 can include a sense amplifier 206 and a compute component 231 configured, in combination, to perform logical operations, e.g., while also utilizing the logic circuitry 570.

As described herein, a controller 540 may be configured to direct the sensing circuitry 550 and/or the logic circuitry 570 selectably coupled to the DRAM array 530 to determine whether to change a counter 536 associated with and/or coupled to a designated column 122 and/or subset 125 of the column based on a bit-wise comparison of a data value determined by the sensing circuitry 550 and/or the logic circuitry 570. The data value may be a number of indicators determined from a number of rows, e.g., 30 rows in the column and/or subset of the column, in some embodiments, after receipt and storage by the second memory device 120-2 of the data batch update sent from the first memory device 120-1, e.g., a first memory array 171 such as a SRAM array. The data value determined from the number of indicators may be compared with a numerical value previously stored by the counter 136. A determination to change the numerical value stored by the counter may be made when a result of the comparison equals a set value, e.g., constant i.

In some embodiments, the second memory device 120-2 may be configured to determine whether the comparison equals the set value by sequential movement of a bit value of each row in which the data value, e.g., indicator, is stored to the coupled sensing circuitry 550 and bit-wise performance of a number of Boolean operations, e.g., a number of AND logical operations, among other possible Boolean operations, and/or a number of INVERT operations using the bit values as operands in a sense amplifier 206 and/or a compute component 231. The second memory device 120-2 may be configured to store a result of either the preceding bit-wise logical operations in the sensing circuitry 550. The second memory device 120-2 may be further configured to change a numerical value of a bit of a multi-bit counter associated with and/or coupled to a designated subset by bit-wise performance of a number of a half-add operations, including a number of logical operations, such as Boolean operations, e.g., a number of AND, OR, and XOR logical operations, among other possible Boolean operations, and/or a number of INVERT (INV) operations using bit values as operands in the sense amplifier 206 and/or the compute component 231. The bits of the multi-bit counter may be changed accordingly to document a frequency of occurrence of data values in the column and/or designated subset as determined by the data batch update.

Embodiments described herein provide a method of operating an apparatus that may be in the form of a computing system 559 including a memory device 520, e.g., as shown in and described in connection with FIG. 5 and elsewhere herein, to change data category values. As described herein, the method can include determining, using a sensing component (not shown) of a SRAM device, e.g., first memory device 120-1, a category of each of a plurality of data values in a received data stream. The method can include assigning an indicator of each of the respective plurality of data values to a respective one of a plurality of designated FIFO components, e.g., as shown at 138-0, 138-1, . . . , 138-X−1 and described in connection with FIG. 1A, in the SRAM device. For example, each data value may be assigned to the respective one of the designated FIFOs based on a distribution of indicators, e.g., counter designations corresponding to a designated column and/or subset of the column in the DRAM device, based on the respective data value corresponding to a particular category of data values. A multiplexer (not shown) may, in some embodiments, be utilized in association with distributing the indicators to the respective one of the designated FIFOs.

The method can include sending the indicators of the respective plurality of data values from the plurality of designated FIFO components as a data batch to a coupled DRAM device, e.g., second memory device 120-2. The method can further include changing a numerical value stored by a plurality of counters, e.g., as shown at 136 and described in connection with FIGS. 1A and 1B, based on receipt of the data batch. Each of the counters 136 may be associated with a respective column of memory cells, e.g., as shown at 122 and described in connection with FIG. 1B, in the DRAM device.

The method may further include storing an indicator of a data value, where the indicator indicates that the data value is in one of a plurality of data categories, in a designated FIFO component corresponding to one of a plurality of data categories. After sending the indicators of the respective plurality of data values to the coupled DRAM device, the method may further include determining from the indicator of the data value the respective column 122 of memory cells in the DRAM device that corresponds to one of the designated FIFO components 138 corresponding to one of a plurality of data categories. In various embodiments, indicators of the respective data values may have operations performed thereon to determine whether a respective counter is to be changed by computation as the indicators are received, e.g., on the fly, by the DRAM device and/or the indicators may be stored in the respective column 122 to enable changing an associated counter 136.

In various embodiments, the indicators of the plurality of data values may be sent as the data batch based on passage of a predetermined time period, e.g., periodically when a set time period has elapsed, and/or the indicators of the plurality of data values may be sent as the data batch based on at least one of the FIFO components being filled with the indicators, among other possible determinants of when the data batch is sent. In some embodiments, the method may further include discarding at least one of the indicators of the plurality of data values stored by the plurality of designated FIFO components when a corresponding FIFO component is full and before the indicators are sent as the data batch, as described elsewhere herein. The indicators of the plurality of data values stored by the plurality of designated FIFO components may be sent to the DRAM device, e.g., serially and/or in parallel, as the data batch.

Changing the numerical value stored by each of a plurality of counters may include performing a respective plurality of bit-wise operations corresponding to a number of counters to be changed, e.g., as described above in connection with the second pseudocode. The bit-wise operation may include performing a number of half-add operations, including a number of Boolean operations, e.g., AND, OR, and XOR logical operations, among other possible Boolean operations, using bit values in the sense amplifier 206 and/or a compute component 231 as operands. Changing the numerical value may be performed after the compare operation described above in connection with the first pseudocode. Implementation of embodiments of the apparatuses and methods to change data category values described herein may reduce the time and/or resource utilization for creation of histograms. A data bus from a SRAM device to a DRAM device configured to transmit data at a rate of 16 gigabits per second (Gb/s) would take about 131.0 microseconds (μs) to send one 2,097,152 bit data batch of indicators to the DRAM. For example, PIM circuitry may, in some embodiments, compare a four bit indicator value from subsets 0 to 14 to each numerical value in the respective counter in about 45 row cycles, or about 1.8 μs at a 40 nanosecond (ns) row cycle time.

Based on these comparison results, each counter in the column may be conditionally changed with 32 half-adds per counter, where each half-add may take about 155 ns, thereby taking about 74.4 μs for 15 counters. This could add up to about 207.2 μs total per data batch or 7055 data batches per second. Depending on a level of allowed inexactness in the resulting histogram, a range of from about $2^{19}$ to about $2^{21}$ indicators per data batch may be used, for a rate of from about $3.7 \times 10^9$ to about $14.8 \times 10^9$ indicators per second in each bank.

This speed of changing data category values, relative to previous approaches, is contributed to by capability of the SRAM device to analyze and assign the disorganized data input from the number of non-volatile and/or volatile system memory sources to the dedicated FIFOs that each correspond to one of the plurality of categories of data. Input of the organized indicators to the DRAM device from the SRAM device may enable more rapid storage of the indicators in the designated columns of memory cells therein than would be enabled by input of the disorganized data directly from the number of non-volatile and/or volatile system memory sources to the DRAM device.

While example embodiments including various combinations and configurations of memory devices, sensing circuitry, logic circuitry, sense amplifiers, compute component, column and column subset configurations, counter configurations, a counters register, and/or a columns register have been illustrated and described herein, embodiments of the present disclosure are not limited to those combinations explicitly recited herein. Other combinations and configurations of the memory devices, sensing circuitry, logic circuitry, sense amplifiers, compute component, column and column subset configurations, counter configurations, a counters register, and/or a columns register disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
 a first memory device, comprising:
  a first array comprising a plurality of first-in, first-out (FIFO) components; and
 wherein the first memory device is configured to:
  store an indicator of a data value, wherein the indicator indicates that the data value is in one of a plurality of data categories, in a designated FIFO component corresponding to the one of the plurality of data categories; and
  send indicators of a plurality of data values stored by a plurality of designated FIFO components as a data batch;
 a dynamic random access memory (DRAM) device, comprising:
  a DRAM array comprising a plurality of columns of memory cells, wherein each of the respective columns of memory cells comprises a plurality of designated subsets of memory cells; and
 wherein the DRAM device is configured to:
  receive the sent indicators, corresponding to the data batch, from the plurality of designated FIFO components of the first memory device to indicate a frequency of occurrence of data values corresponding to the indicators received from the designated FIFO components; and
  store each of the received indicators in a designated subset of the plurality of subsets of memory cells in each of the plurality of columns and wherein the plurality of subsets of memory cells corresponds to the frequency of occurrence of the data values in the plurality of data categories.
2. The apparatus of claim 1, wherein each of the indicators received from the first memory device comprises a plurality of bits of a designation corresponding to the designated subset of the plurality of subsets of memory cells.

3. The apparatus of claim 2, wherein the designation corresponds to a counter associated with the one of the plurality of designated subsets of memory cells in the DRAM array.

4. The apparatus of claim 1, wherein the DRAM device further comprises a counter configured to document a number of changes to the one of the plurality of data categories corresponding to the one of the plurality of designated subsets of memory cells in the DRAM array.

5. The apparatus of claim 1, wherein the DRAM device further comprises sensing circuitry selectably coupled to the DRAM array, the sensing circuitry including a sense amplifier and a compute component configured, in combination, to perform logical operations.

6. The apparatus of claim 1, wherein the apparatus further comprises:
a controller configured to direct sensing circuitry selectably coupled to the DRAM array to:
determine whether to change a counter associated with a designated subset based on a bit-wise comparison of a data value, determined by the sensing circuitry after receipt of a data batch update from the first array, with a numerical value previously stored by the counter; and
wherein a determination is made to change the numerical value stored by the counter when a result of the comparison equals a set value.

7. The apparatus of claim 6, wherein the DRAM device is further configured to:
determine whether the comparison equals the set value by:
sequential movement of a bit value of each row in which the data value is stored to coupled sensing circuitry;
bit-wise performance of a number of logical operations using the bit values as operands in a sense amplifier and a compute component; and
store a result of at least one of the bit-wise logical operations in the sensing circuitry.

8. The apparatus of claim 1, wherein the DRAM device is further configured to:
change a numerical value of a bit of a multi-bit counter associated with a designated subset by:
bit-wise performance of a half-add operation, including a number of logical operations using bit values as operands, in a sense amplifier and a compute component; and
wherein bits of the multi-bit counter are changed accordingly to document a frequency of occurrence of data values in the designated subset as determined by a data batch update.

9. The apparatus of claim 1, wherein:
the indicator of the data value stored by the designated FIFO component designates a counter associated with the one of the plurality of designated subsets of memory cells in a designated column of memory cells in the DRAM array; and
the data value corresponding to the indicator is stored by the one of the plurality of designated subsets of memory cells in the designated column of memory cells.

10. An apparatus, comprising:
a static random access memory (SRAM) device, comprising:
a first array comprising a plurality of first-in, first-out (FIFO) components; and
wherein the SRAM device is configured to:
store an indicator of a data value, wherein the indicator indicates that the data value is in one of a plurality of data categories, in a designated FIFO component corresponding to the one of the plurality of data categories; and
send indicators of a plurality of data values stored by a plurality of designated FIFO components as a data batch;
a dynamic random access memory (DRAM) device, comprising:
a DRAM array comprising a plurality of columns of memory cells, wherein each of the respective columns of memory cells comprises a plurality of designated subsets of memory cells; and
wherein the DRAM device is configured to:
receive the sent indicators, corresponding to the data batch, from the plurality of designated FIFO components of the SRAM device to indicate a frequency of occurrence of data values corresponding to the indicators received from the designated FIFO components; and
store each of the received indicators in a designated subset of the plurality of subsets of memory cells in each of the plurality of columns and wherein the plurality of subsets of memory cells corresponds to the frequency of occurrence of the data values in the plurality of data categories.

11. The apparatus of claim 10, wherein the indicator indicates that the data value is in one of a plurality of data categories and wherein each of the plurality of data categories corresponds to a particular data value or a range of data values.

12. The apparatus of claim 10, wherein the SRAM is further configured to send the indicators of the plurality of data values as the data batch based on passage of a predetermined time period.

13. The apparatus of claim 10, wherein the SRAM is further configured to send the indicators of the plurality of data values as the data batch based on at least one of the FIFO components being filled with the indicators.

14. The apparatus of claim 10, wherein the DRAM is further configured to generate a histogram based on the indicators.

15. A method, comprising:
storing, in a first memory device, an indicator of a data value, wherein the indicator indicates that the data value is in one of a plurality of data categories, in a designated first-in, first-out (FIFO) component of the first memory device corresponding to the one of the plurality of data categories; and
sending indicators of a plurality of data values stored by a plurality of designated FIFO components as a data batch;
receiving the sent indicators, corresponding to the data batch, from the plurality of designated FIFO components of the first memory device to indicate a frequency of occurrence of data values corresponding to the indicators received from the designated FIFO components; and
storing each of the received indicators in a designated subset of a plurality of subsets of memory cells, of a dynamic random access memory (DRAM) device, in each of a plurality of columns, wherein each of the plurality of columns of memory cells comprises a plurality of designated subsets of memory cells and wherein the plurality of subsets of memory cells corresponds to the frequency of occurrence of the data values in the plurality of data categories.

16. The method of claim 15, further comprising modifying, to perform a corner turn operations, address bits corresponding to the plurality of data values to an address of a designator subset of memory cells.

17. The method of claim 16, further comprising modifying the address bits from a designated FIFO component to an address of the designated subset of memory cells.

18. The method of claim 16, wherein the address bits are modified on a per column basis.

* * * * *